(12) United States Patent
Hadjichristos et al.

(10) Patent No.: US 12,081,243 B2
(45) Date of Patent: Sep. 3, 2024

(54) LOW NOISE AMPLIFIERS WITH COMBINED OUTPUTS

(75) Inventors: Aristotele Hadjichristos, San Diego, CA (US); Gurkanwal Singh Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 96 days.

(21) Appl. No.: 13/366,992

(22) Filed: Feb. 6, 2012

(65) Prior Publication Data

US 2013/0043946 A1 Feb. 21, 2013

Related U.S. Application Data

(60) Provisional application No. 61/524,250, filed on Aug. 16, 2011.

(51) Int. Cl.
*H04B 1/00* (2006.01)
*H03F 1/02* (2006.01)
(Continued)

(52) U.S. Cl.
CPC ......... *H04B 1/0057* (2013.01); *H03F 1/0277* (2013.01); *H03F 1/223* (2013.01);
(Continued)

(58) Field of Classification Search
CPC ........ H04B 1/0057; H04B 1/406; H04B 1/48; H03F 1/0277; H03F 1/223; H03F 1/56;
(Continued)

(56) References Cited

U.S. PATENT DOCUMENTS 3,911,364 A 10/1975 Langseth et al.
4,035,728 A 7/1977 Ishikawa et al.
(Continued)

FOREIGN PATENT DOCUMENTS

CN 1523912 A 8/2004
CN 1922795 A 2/2007
(Continued)

OTHER PUBLICATIONS

Henrik Morkner et al., "A Full Duplex Front End Module for WiFi 802.11.n Applications", European Microwave Association, vol. 12, No. 4, pp. 162-165, Oct. 2008.
(Continued)

*Primary Examiner* — Yuwen Pan
*Assistant Examiner* — Fatuma G Sherif
(74) *Attorney, Agent, or Firm* — Seyfarth Shaw LLP/Qualcomm Incorporated

(57) ABSTRACT

Multiple low noise amplifiers (LNAs) with combined outputs are disclosed. In an exemplary design, an apparatus includes a front-end module and an integrated circuit (IC). The front-end module includes a plurality of LNAs having outputs that are combined. The IC includes receive circuits coupled to the plurality of LNAs via a single interconnection. In an exemplary design, each of the plurality of LNAs may be enabled or disabled via a respective control signal for that LNA. The front-end module may also include receive filters coupled to the plurality of LNAs and a switchplexer coupled to the receive filters. The front-end module may further include at least one power amplifier, and the IC may further include transmit circuits coupled to the at least one power amplifier.

20 Claims, 10 Drawing Sheets

(51) Int. Cl.
*H03F 1/22* (2006.01)
*H03F 1/56* (2006.01)
*H03F 3/21* (2006.01)
*H03F 3/45* (2006.01)
*H03F 3/68* (2006.01)
*H03F 3/72* (2006.01)
*H04B 1/403* (2015.01)

(52) U.S. Cl.
CPC ............ *H03F 1/56* (2013.01); *H03F 3/211* (2013.01); *H03F 3/45179* (2013.01); *H03F 3/68* (2013.01); *H03F 3/72* (2013.01); *H04B 1/406* (2013.01); *H03F 2200/222* (2013.01); *H03F 2200/294* (2013.01); *H03F 2200/429* (2013.01); *H03F 2203/7203* (2013.01); *H03F 2203/7236* (2013.01)

(58) Field of Classification Search
CPC ........ H03F 3/211; H03F 3/45179; H03F 3/68; H03F 3/72; H03F 2200/222; H03F 2200/294; H03F 2200/429; H03F 2203/7203; H03F 2203/7236
USPC .............................................. 455/232.1, 132
See application file for complete search history.

(56) References Cited

U.S. PATENT DOCUMENTS

| | | |
|---|---|---|
| 4,035,729 A | 7/1977 | Perry |
| 4,246,655 A | 1/1981 | Parker |
| 4,326,294 A | 4/1982 | Okamoto et al. |
| 4,715,048 A | 12/1987 | Masamura |
| 4,742,563 A | 5/1988 | Fukumura |
| 4,756,023 A | 7/1988 | Kojima |
| 4,969,207 A | 11/1990 | Sakamoto et al. |
| 5,056,411 A | 10/1991 | Baker |
| 5,128,630 A | 7/1992 | Mijuskovic |
| 5,291,519 A | 3/1994 | Tsurumaru |
| 5,321,850 A | 6/1994 | Backstrom et al. |
| 5,345,601 A | 9/1994 | Takagi et al. |
| 5,390,342 A | 2/1995 | Takayama et al. |
| 5,559,838 A | 9/1996 | Nakagoshi |
| 5,566,364 A | 10/1996 | Mizoguchi et al. |
| 5,694,396 A | 12/1997 | Firouzbakht et al. |
| 5,697,083 A | 12/1997 | Sano |
| 5,761,613 A | 6/1998 | Saunders et al. |
| 5,794,159 A | 8/1998 | Portin |
| 5,805,643 A | 9/1998 | Seki et al. |
| 5,805,989 A | 9/1998 | Ushida |
| 5,835,853 A | 11/1998 | Enoki et al. |
| 5,940,452 A | 8/1999 | Rich |
| 5,999,815 A | 12/1999 | Tenbrook et al. |
| 5,999,990 A | 12/1999 | Sharrit et al. |
| 6,026,288 A | 2/2000 | Bronner |
| 6,029,052 A * | 2/2000 | Isberg ................ H03J 5/244 455/190.1 |
| 6,040,732 A | 3/2000 | Brokaw |
| 6,044,254 A | 3/2000 | Ohta et al. |
| 6,063,961 A | 5/2000 | Kroner |
| 6,069,923 A | 5/2000 | Ostman et al. |
| 6,088,348 A | 7/2000 | Bell, III |
| 6,127,886 A | 10/2000 | Khabbaz et al. |
| 6,208,844 B1 | 3/2001 | Abdelgany |
| 6,249,687 B1 | 6/2001 | Thomsen et al. |
| 6,407,689 B1 | 6/2002 | Bazarjani et al. |
| 6,424,683 B1 | 7/2002 | Schoellhorn |
| 6,430,237 B1 | 8/2002 | Anvari |
| 6,472,947 B1 | 10/2002 | Zeitz |
| 6,473,601 B1 | 10/2002 | Oda |
| 6,522,895 B1 | 2/2003 | Montalvo |
| 6,535,725 B2 | 3/2003 | Hatcher et al. |
| 6,600,759 B1 | 7/2003 | Wood |
| 6,600,907 B1 | 7/2003 | Taguchi |
| 6,600,931 B2 | 7/2003 | Sutton et al. |
| 6,657,498 B2 | 12/2003 | Park et al. |
| 6,806,777 B2 | 10/2004 | Franca-Neto |
| 6,819,941 B2 | 11/2004 | Dening et al. |
| 6,888,888 B1 | 5/2005 | Tu et al. |
| 6,952,594 B2 | 10/2005 | Hendin |
| 6,954,446 B2 | 10/2005 | Kuffner |
| 6,983,132 B2 | 1/2006 | Woo et al. |
| 6,985,712 B2 | 1/2006 | Yamakawa et al. |
| 6,987,950 B2 | 1/2006 | Coan |
| 7,013,166 B2 | 3/2006 | Clifford |
| 7,024,172 B1 | 4/2006 | Murphy et al. |
| 7,039,377 B2 | 5/2006 | Yates |
| 7,123,891 B2 | 10/2006 | Loke |
| 7,142,042 B1 | 11/2006 | Henry |
| 7,161,423 B2 | 1/2007 | Paul et al. |
| 7,167,044 B2 | 1/2007 | Li et al. |
| 7,187,239 B2 | 3/2007 | Yeh |
| 7,187,735 B2 | 3/2007 | Kent, III |
| 7,187,904 B2 | 3/2007 | Gainey et al. |
| 7,212,788 B2 | 5/2007 | Weber et al. |
| 7,224,231 B2 | 5/2007 | Wu |
| 7,260,377 B2 | 8/2007 | Burns et al. |
| 7,283,851 B2 | 10/2007 | Persico et al. |
| 7,299,021 B2 | 11/2007 | Parssinen et al. |
| 7,313,368 B2 | 12/2007 | Wu et al. |
| 7,317,894 B2 | 1/2008 | Hirose |
| 7,333,831 B2 | 2/2008 | Srinivasan et al. |
| 7,356,325 B2 | 4/2008 | Behzad et al. |
| 7,403,508 B1 | 7/2008 | Miao |
| 7,444,166 B2 | 10/2008 | Sahota et al. |
| 7,454,181 B2 | 11/2008 | Banister et al. |
| 7,477,106 B2 | 1/2009 | Van Bezooijen et al. |
| 7,570,111 B1 | 8/2009 | Vagher et al. |
| 7,599,675 B2 | 10/2009 | Mu et al. |
| 7,643,847 B2 | 1/2010 | Daanen et al. |
| 7,643,848 B2 | 1/2010 | Robinett et al. |
| 7,697,905 B2 | 4/2010 | Lee et al. |
| 7,728,664 B2 | 6/2010 | Chang et al. |
| 7,751,513 B2 | 7/2010 | Eisenhut et al. |
| 7,764,726 B2 | 7/2010 | Simic et al. |
| 7,848,724 B2 | 12/2010 | Bult et al. |
| 7,869,528 B2 | 1/2011 | Robinson |
| 7,877,075 B1 | 1/2011 | Jin et al. |
| 7,911,269 B2 | 3/2011 | Yang et al. |
| 7,944,298 B2 | 5/2011 | Cabanillas et al. |
| 7,949,309 B2 | 5/2011 | Rofougaran et al. |
| 7,952,398 B2 | 5/2011 | Salcido et al. |
| 8,022,772 B2 | 9/2011 | Cassia et al. |
| 8,055,229 B2 | 11/2011 | Huang |
| 8,063,706 B2 | 11/2011 | Li et al. |
| 8,081,672 B2 | 12/2011 | Kent et al. |
| 8,090,332 B2 | 1/2012 | Sahota et al. |
| 8,090,369 B2 | 1/2012 | Kitazoe |
| 8,139,670 B1 | 3/2012 | Son et al. |
| 8,149,955 B2 | 4/2012 | Tired |
| 8,195,117 B2 | 6/2012 | Bult et al. |
| 8,208,887 B2 | 6/2012 | Lee et al. |
| 8,217,723 B2 | 7/2012 | Rajendran et al. |
| 8,242,841 B2 | 8/2012 | Zhang |
| 8,270,927 B2 | 9/2012 | Wallace et al. |
| 8,290,449 B2 | 10/2012 | Keehr et al. |
| 8,295,778 B2 | 10/2012 | Kotecha et al. |
| 8,306,494 B2 | 11/2012 | Ojo |
| 8,442,473 B1 | 5/2013 | Kaukovuori et al. |
| 8,514,015 B2 | 8/2013 | Chen |
| 8,600,315 B2 | 12/2013 | Roufoogaran et al. |
| 8,600,335 B2 | 12/2013 | Manetakis |
| 8,626,084 B2 | 1/2014 | Chan et al. |
| 8,676,148 B2 | 3/2014 | Ogasawara |
| 8,706,069 B2 | 4/2014 | Khoini-Poorfard et al. |
| 9,705,537 B1 * | 7/2017 | Bauder ................ H04B 1/0458 |
| 2002/0008575 A1 | 1/2002 | Oskowsky et al. |
| 2002/0061773 A1 | 5/2002 | Adachi et al. |
| 2002/0111163 A1 | 8/2002 | Hamabe |
| 2002/0132597 A1 | 9/2002 | Peterzell et al. |
| 2002/0173337 A1 | 11/2002 | Hajimiri et al. |
| 2002/0193108 A1 | 12/2002 | Robinett |
| 2003/0076797 A1 | 4/2003 | Lozano |
| 2003/0081694 A1 | 5/2003 | Wieck |

(56) References Cited

U.S. PATENT DOCUMENTS

| | | |
|---|---|---|
| 2003/0125040 A1 | 7/2003 | Walton et al. |
| 2003/0148750 A1 | 8/2003 | Yan et al. |
| 2003/0157915 A1 | 8/2003 | Atkinson et al. |
| 2003/0176176 A1 | 9/2003 | Leinonen et al. |
| 2003/0203743 A1 | 10/2003 | Sugar et al. |
| 2003/0206076 A1 | 11/2003 | Hashemi et al. |
| 2003/0228851 A1 | 12/2003 | Taniguchi |
| 2004/0087290 A1 | 5/2004 | Schmidt et al. |
| 2004/0092243 A1 | 5/2004 | Hey-Shipton |
| 2004/0113746 A1 | 6/2004 | Brindle |
| 2004/0116086 A1 | 6/2004 | Huttunen |
| 2004/0121753 A1 | 6/2004 | Sugar et al. |
| 2004/0204104 A1 | 10/2004 | Horng et al. |
| 2004/0219959 A1 | 11/2004 | Khayrallah et al. |
| 2004/0224643 A1 | 11/2004 | Nakai |
| 2004/0253955 A1 | 12/2004 | Love et al. |
| 2004/0266356 A1 | 12/2004 | Javor et al. |
| 2005/0039060 A1 | 2/2005 | Okayasu |
| 2005/0075077 A1 | 4/2005 | Mach et al. |
| 2005/0079847 A1 | 4/2005 | Arafa |
| 2005/0117663 A1 | 6/2005 | Drogi et al. |
| 2005/0118977 A1 | 6/2005 | Drogi et al. |
| 2005/0197090 A1 | 9/2005 | Stockstad et al. |
| 2005/0215264 A1 | 9/2005 | Subramaniam et al. |
| 2005/0231290 A1 | 10/2005 | Hung et al. |
| 2005/0265084 A1 | 12/2005 | Choi |
| 2005/0277387 A1 | 12/2005 | Kojima et al. |
| 2006/0009177 A1 | 1/2006 | Persico et al. |
| 2006/0023745 A1 | 2/2006 | Koo et al. |
| 2006/0061773 A1 | 3/2006 | Lee et al. |
| 2006/0084469 A1* | 4/2006 | Malone ............... H04B 1/0053 455/552.1 |
| 2006/0121937 A1* | 6/2006 | Son ................... H04B 1/0053 455/553.1 |
| 2006/0128322 A1* | 6/2006 | Igarashi ............... H03G 3/3068 455/78 |
| 2006/0128330 A1* | 6/2006 | Rooyen ............... H04H 20/57 455/180.2 |
| 2006/0128338 A1 | 6/2006 | Kerth et al. |
| 2006/0146693 A1 | 7/2006 | Mori et al. |
| 2006/0170503 A1 | 8/2006 | Lee et al. |
| 2006/0189286 A1 | 8/2006 | Kyu et al. |
| 2006/0222100 A1 | 10/2006 | Behzad |
| 2006/0234662 A1 | 10/2006 | Diloisy |
| 2006/0291428 A1 | 12/2006 | Filipovic |
| 2007/0042802 A1 | 2/2007 | Park et al. |
| 2007/0049332 A1 | 3/2007 | Higuchi |
| 2007/0060080 A1 | 3/2007 | Nishimura et al. |
| 2007/0072577 A1* | 3/2007 | Rozenblit et al. ............ 455/333 |
| 2007/0105517 A1 | 5/2007 | Chang et al. |
| 2007/0142013 A1 | 6/2007 | Bucknor et al. |
| 2007/0177656 A1 | 8/2007 | Maruta et al. |
| 2007/0177693 A1 | 8/2007 | Kluge |
| 2007/0184801 A1 | 8/2007 | Kogawa et al. |
| 2007/0197170 A1 | 8/2007 | Boos |
| 2007/0197178 A1 | 8/2007 | Gu |
| 2007/0197204 A1 | 8/2007 | Herczog et al. |
| 2007/0202890 A1 | 8/2007 | Feher |
| 2007/0242784 A1 | 10/2007 | Sampson et al. |
| 2007/0243832 A1 | 10/2007 | Park et al. |
| 2007/0262817 A1 | 11/2007 | Ciccarelli et al. |
| 2007/0262871 A1 | 11/2007 | Yamagajo et al. |
| 2008/0003967 A1* | 1/2008 | Kuroda ............... H03G 3/3068 455/232.1 |
| 2008/0004078 A1 | 1/2008 | Barratt et al. |
| 2008/0013654 A1 | 1/2008 | Rick et al. |
| 2008/0117999 A1 | 5/2008 | Kadous et al. |
| 2008/0139151 A1 | 6/2008 | Ojo et al. |
| 2008/0204148 A1* | 8/2008 | Kim ................... H03F 1/223 330/306 |
| 2008/0224770 A1 | 9/2008 | Kim et al. |
| 2008/0224791 A1 | 9/2008 | Cheng |
| 2008/0225971 A1 | 9/2008 | Behzad |
| 2008/0261650 A1 | 10/2008 | Piriyapoksombut et al. |
| 2008/0297259 A1* | 12/2008 | Mu ..................... H03F 1/52 330/296 |
| 2009/0124223 A1 | 5/2009 | Kyranas et al. |
| 2009/0124227 A1 | 5/2009 | Ishiguro |
| 2009/0227214 A1 | 9/2009 | Georgantas et al. |
| 2009/0237161 A1 | 9/2009 | Fagg |
| 2009/0243869 A1 | 10/2009 | Sanderford, Jr. |
| 2009/0253456 A1 | 10/2009 | Toh et al. |
| 2009/0290659 A1 | 11/2009 | Petrovic et al. |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0041359 A1 | 2/2010 | Liu et al. |
| 2010/0105425 A1* | 4/2010 | Asokan ............... H04B 1/0458 455/552.1 |
| 2010/0142440 A1 | 6/2010 | Inoue |
| 2010/0195754 A1 | 8/2010 | Li et al. |
| 2010/0197263 A1 | 8/2010 | Dwyer et al. |
| 2010/0210226 A1 | 8/2010 | Matsuyama |
| 2010/0210272 A1 | 8/2010 | Sundstrom et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0253435 A1* | 10/2010 | Ichitsubo ............. H01L 25/0655 29/832 |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0291888 A1* | 11/2010 | Hadjichristos ......... H03F 3/72 455/127.4 |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0110463 A1 | 5/2011 | Chang et al. |
| 2011/0122972 A1 | 5/2011 | Lie et al. |
| 2011/0150140 A1* | 6/2011 | Alexopoulos ......... H01P 1/20381 333/175 |
| 2011/0165848 A1 | 7/2011 | Gorbachov et al. |
| 2011/0193625 A1 | 8/2011 | Gatta et al. |
| 2011/0194504 A1 | 8/2011 | Gorokhov et al. |
| 2011/0204973 A1 | 8/2011 | Hu et al. |
| 2011/0211533 A1 | 9/2011 | Casaccia et al. |
| 2011/0217945 A1 | 9/2011 | Uehara et al. |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0292844 A1 | 12/2011 | Kwun et al. |
| 2011/0299434 A1 | 12/2011 | Gudem et al. |
| 2011/0300810 A1 | 12/2011 | Mikhemar et al. |
| 2011/0304388 A1* | 12/2011 | Yamawaki ............ H04B 1/52 327/557 |
| 2012/0009886 A1 | 1/2012 | Poulin |
| 2012/0013387 A1 | 1/2012 | Sankaranarayanan et al. |
| 2012/0026862 A1 | 2/2012 | Sadri et al. |
| 2012/0044927 A1 | 2/2012 | Pan et al. |
| 2012/0056681 A1 | 3/2012 | Lee |
| 2012/0057621 A1 | 3/2012 | Hong et al. |
| 2012/0195237 A1 | 8/2012 | Chan et al. |
| 2012/0236829 A1 | 9/2012 | Takano et al. |
| 2012/0293265 A1 | 11/2012 | Heikkinen et al. |
| 2012/0294299 A1 | 11/2012 | Fernando |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0003783 A1 | 1/2013 | Gudem et al. |
| 2013/0051284 A1 | 2/2013 | Khlat |

(56) References Cited

U.S. PATENT DOCUMENTS

| | | |
|---|---|---|
| 2013/0114769 A1 | 5/2013 | Fernando |
| 2013/0163492 A1 | 6/2013 | Wong |
| 2013/0217398 A1 | 8/2013 | Winiecki et al. |
| 2013/0230080 A1 | 9/2013 | Gudem et al. |
| 2013/0231064 A1 | 9/2013 | Gudem et al. |
| 2013/0265892 A1 | 10/2013 | Fernando |
| 2013/0315348 A1 | 11/2013 | Tasic et al. |
| 2013/0316668 A1 | 11/2013 | Davierwalla et al. |
| 2013/0316669 A1 | 11/2013 | Davierwalla et al. |
| 2013/0316670 A1 | 11/2013 | Tasic et al. |
| 2013/0329665 A1 | 12/2013 | Kadous et al. |
| 2014/0072001 A1 | 3/2014 | Chang et al. |
| 2014/0113578 A1 | 4/2014 | Xu |
| 2014/0269853 A1 | 9/2014 | Gudem et al. |

FOREIGN PATENT DOCUMENTS

| | | |
|---|---|---|
| CN | 101228702 A | 7/2008 |
| CN | 101242158 A | 8/2008 |
| CN | 101523967 A | 9/2009 |
| CN | 101789805 A | 7/2010 |
| EP | 1164719 A1 | 12/2001 |
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 1755230 A2 | 2/2007 |
| EP | 1761076 A2 | 3/2007 |
| EP | 2068583 A1 | 6/2009 |
| EP | 2141818 A1 | 1/2010 |
| EP | 1916767 B1 | 12/2010 |
| EP | 2393205 A2 | 12/2011 |
| EP | 2398285 A1 | 12/2011 |
| GB | 2472978 A | 3/2011 |
| JP | 05227234 | 9/1993 |
| JP | H0730452 A | 1/1995 |
| JP | 07221684 | 8/1995 |
| JP | 9027778 A | 1/1997 |
| JP | 09116458 | 5/1997 |
| JP | H11127300 A | 5/1999 |
| JP | 2000013278 A | 1/2000 |
| JP | 2000216696 A | 8/2000 |
| JP | 2001285114 | 10/2001 |
| JP | 2002261880 A | 9/2002 |
| JP | 2004015162 A | 1/2004 |
| JP | 2006520143 A | 8/2006 |
| JP | 2007324711 A | 12/2007 |
| JP | 2008085793 A | 4/2008 |
| JP | 2008519535 A | 6/2008 |
| JP | 2009010826 A | 1/2009 |
| JP | 2009502065 A | 1/2009 |
| JP | 2009130867 A | 6/2009 |
| JP | 2009523338 A | 6/2009 |
| JP | 2009219023 A | 9/2009 |
| JP | 2010016501 A | 1/2010 |
| JP | 2010528545 A | 8/2010 |
| JP | 2011015112 A | 1/2011 |
| JP | 2011082669 A | 4/2011 |
| JP | 2011091747 A | 5/2011 |
| JP | 2011119807 A | 6/2011 |
| WO | 01050636 | 7/2001 |
| WO | 2002037686 | 5/2002 |
| WO | 05039060 | 4/2005 |
| WO | 2005062477 A2 | 7/2005 |
| WO | 2005088847 A1 | 9/2005 |
| WO | 2006050515 A2 | 5/2006 |
| WO | 2006118538 A2 | 11/2006 |
| WO | 2007012465 A1 | 2/2007 |
| WO | 2007079987 A1 | 7/2007 |
| WO | 2008059257 A1 | 5/2008 |
| WO | 2008084539 A1 | 7/2008 |
| WO | 08103757 | 8/2008 |
| WO | 2008092745 A1 | 8/2008 |
| WO | 2008145604 A1 | 12/2008 |
| WO | 2010059257 A1 | 5/2010 |
| WO | 2011019850 A1 | 2/2011 |
| WO | 2011050729 A1 | 5/2011 |
| WO | 2011092005 A1 | 8/2011 |
| WO | 2011138697 A1 | 11/2011 |
| WO | 2012008705 A2 | 1/2012 |
| WO | 2012049529 A1 | 4/2012 |
| WO | 2013036794 A1 | 3/2013 |
| WO | 2013131047 | 9/2013 |

OTHER PUBLICATIONS

Jussi Ryynanen et al., "A Dual-Band RF Front-End for WCDMA and GSM Applications", IEEE, Journal Solid-State Circuits, 2001, vol. 36, No. 8, pp. 1198-1204.

Kevin Walsh et al., "3G/4G Multimode Cellular Front End Challenges", Part 2: Architecture Discussion, RFMD® White Paper, 9 pages.

Lee et al., "Development of Miniature Quad SAW filter bank based on PCB substrate", IEEE Intl Frequency Control Symp, pp. 146-149, 200715.

Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.

Tasic A. et al., "Design of Adaptive Multimode RF Front-End Circuits", IEEE Journal of Solid-State Circuits, vol. 42, Issue 2, Feb. 2007 pp. 313-322.

"UMTS Picocell Front End Module", CTS Corp. 8 pages.

Philips: "Capabilities of multi-transceiver UES", 3GPP Draft; R1-103913, 3rd Generation Partnership Project (3GPP), Mobile Competence Centre; 650, Route Des Lucioles; F-06921 Sophia-Antipolis Cedex; France, vol. RAN WG1, No. Dresden, Germany; Jun. 28, 2010, Jun. 22, 2010 (Jun. 22, 2010), XP050449298, [retrieved on Jun. 22, 2010] the whole document.

3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.

Aparin et al., "A Highly-integrated tri-band/quad-mode SiGe BiCMOS RF-to-baseband and receiver for wireless CDMA/WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.

Broyde F., et al., "The Noise Performance of aMultiple-Input-Port and Multiple-Output-Port Low-Noise Amplifier Connected to an Array of Coupled Antennas," International Journal of Antennas and Propagation, vol. 2011, Article ID 438478, Jul. 18, 2011, 12 pages.

Chen, et al, "A 5-6 GHz 1-V CMOS Direct-Conversion Receiver With an Integrated Quadrature Coupler," IEEE Journal of Solid-State Circuits, vol. 42, No. 9, 2007, pp. 1963-1975.

Chen, et al., "A monolithic 5.9-GHz CMOS I/Q direct-down converter utilizing a quadrature coupler and transformer-coupled subharmonic mixers," Microwave and Wireless Components Letters, IEEE , vol. 16, No. 4, 2006, pp. 197-199.

Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.

Hashemi, et al., "Concurrent Multiband Low-Noise Amplifiers—Theory, Design, and Applications," IEEE Transactions on Microwave Theory and Techniques, vol. 50, No. 1, Jan. 2002.

Hwang, et al., "A High IIP2 Direct-Conversion Receiver using Even-Harmonic Reduction Technique for Cellular CDMA/PCS/GPS applications," IEEE Transaction on Circuits and Systems.

International Search Report and Written Opinion—PCT/US2012/051237—ISA/EPO—Dec. 6, 2012.

Jones W. W., et al., "Narrowband interference suppression using filter-bank analysis/synthesis techniques", Military Communications Conference, 1992. MILC0M '92, Conference Recor D. Communications—Fusing Command, Control and Intelligence., IEEE San Diego, CA, USA, Oct. 11, 14, 1992, New York, NY, USA,

(56) References Cited

OTHER PUBLICATIONS

IEEE, US, Oct. 11, 1992 (Oct. 11, 1992), pp. 898-902, XP010060840, DOI: 10.1109/MILCOM.1992.243977, ISBN: 978-0-7803-0585-4.
Kim, T.W., et al., Highly Linear Receiver Front-End Adopting MOSFET Transconductance Linearization by Multiple Gated Transistors, IEEE Journal of Solid-State Circuits, United States, IEEE, Jan. 1, 2004, vol. 39, No. 1, pp. 223-229.
Lai, C.M., et al., "Compact router transceiver architecture for carrier aggregation systems", Microwave Conference (EUMC), 2011 41st European, IEEE, Oct. 10, 2011 (Oct. 10, 2011), pp. 693-696, XP032072825, ISBN: 978-1-61284-235-6 the whole document.
MSM6000 Chipset Solution, Qualcomm Incorporated.
MSM6500 Chipset Solution, Qualcomm Incorporated.
Qualcomm Europe: "UE Implementation Impact due to 4C-HSDPA Operation", 3GPP Draft; R1-094067_UE_IMPL_IMPACT_4C_HSDPA, 3rd Generation Partnership Project (3GPP), Mobile Competence Centre; 650, Route Des Lucioles; F-06921 Sophia-Antipolis Cedex ; France, No. Miyazaki; Oct. 12, 2009, Oct. 12, 2009 (Oct. 12, 2009), XP050388547, [retrieved on Oct. 6, 2009].
Rahn D.G., et al., "A fully integrated multiband MIMO WLAN transceiver RFIC," IEEE J. Solid-State Circuits, 2005, vol. 40 (8), 1629-1641.
Sever et al. "A Dual-Antenna Phase-Array Ultra-Wideband CMOS Transceiver". IEEE Communications Magazine [Online] 2006, vol. 44, Issue 8, pp. 102-110. See pp. 104-107.
Winternitz, et al., "A GPS Receiver for High-Altitude Satellite Navigation," IEEE Journal of Selected Topics in Signal Processing, vol. 3, No. 4, pp. 541-556, Aug. 2009.
European Search Report—EP18169097—Search Authority—Munich—Oct. 4, 2018.
Erdogan O.E., et al., "A Single-Chip Quad-Band GSM/GPRS Transceiver in 0.18 µm Standard CMOS", ISSCC 2005/Session 17/RF Cellular ICs/17.6, IEEE International Solid-State Circuits Conference, Feb. 8, 2005, 3 Pages.

\* cited by examiner

LOW NOISE AMPLIFIERS WITH COMBINED OUTPUTS

CROSS-REFERENCE TO RELATED APPLICATION

The present Application for Patent claims priority to Provisional Application No. 61/524,250, entitled "Method and apparatus for RF front end area and component reduction" filed Aug. 16, 2011, and assigned to the assignee hereof and hereby expressly incorporated by reference herein.

BACKGROUND

I. Field

The present disclosure relates generally to electronics, and more specifically to low noise amplifiers (LNAs).

II. Background

A wireless device (e.g., a cellular phone or a smart phone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an output RF signal having the proper output power level, and transmit the output RF signal via an antenna to a base station. For data reception, the receiver may obtain a received RF signal via the antenna and may amplify and process the received RF signal to recover data sent by the base station.

A wireless device may include multiple receivers to support different frequency bands, different radio technologies, receive diversity, etc. It is desirable to implement the receivers to achieve good performance while reducing circuitry and cost.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

A wireless device comprising multiple LNAs with combined outputs is described herein. Combining the LNA outputs may reduce interconnections, input/output (I/O) ports, circuitry, circuit area, cost, etc., as described below.

Figure 1:
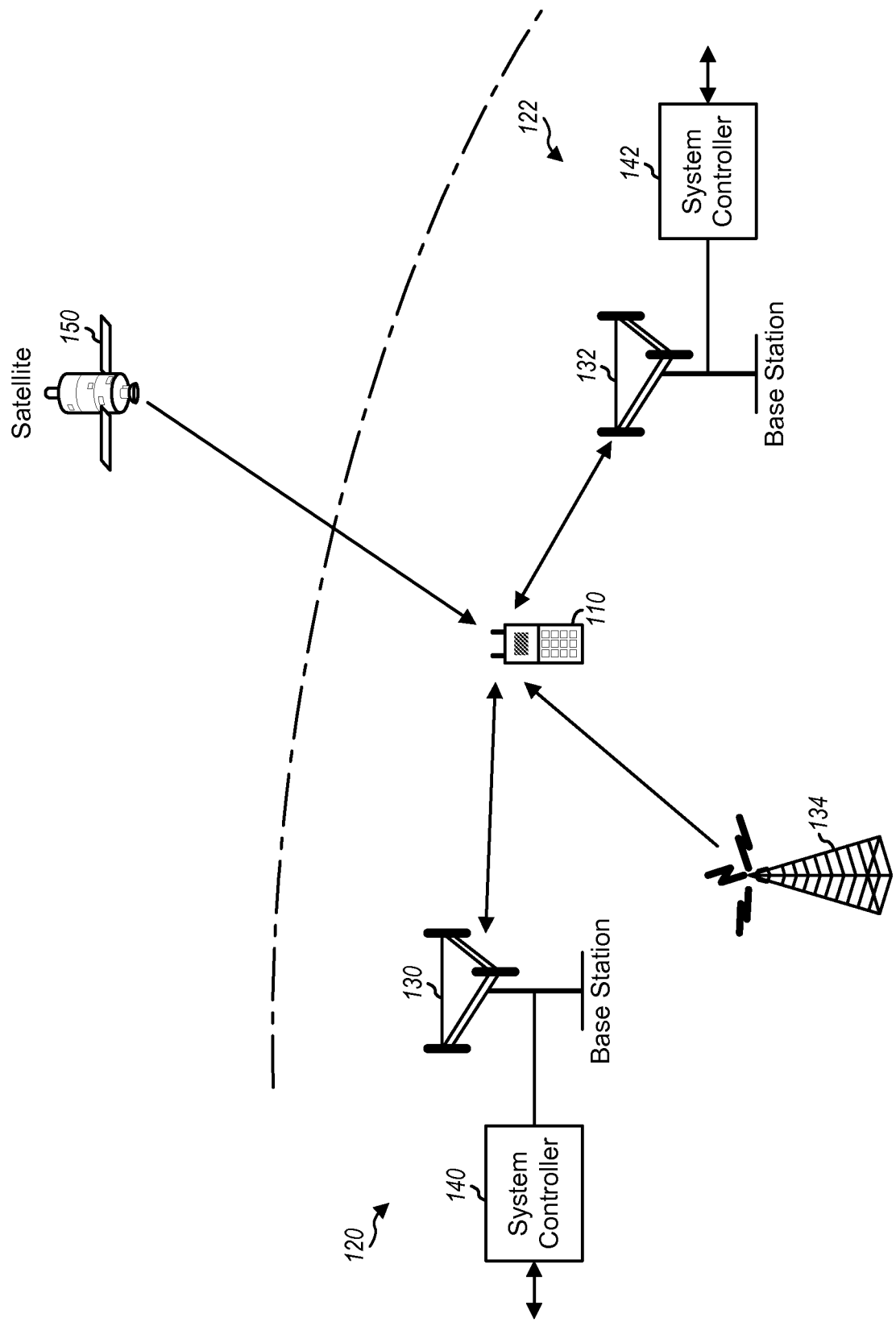
FIG. 1 shows a wireless device capable of communicating with different wireless communication systems.

FIG. 1 shows a wireless device 110 capable of communicating with different wireless communication systems 120 and 122. Wireless systems 120 and 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), cdma2000, or some other version of CDMA. For simplicity, FIG. 1 shows wireless system 120 including one base station 130 and one system controller 140, and wireless system 122 including one base station 132 and one system controller 142. In general, each wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smart phone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134). Wireless device 110 may also be capable of receiving signals from satellites (e.g., a satellite 150) in one or more global navigation satellite systems (GNSS). Wireless device 110 may support one or more radio technologies for wireless communication such as LTE, cdma2000, WCDMA, GSM, 802.11, etc.

Figure 2:
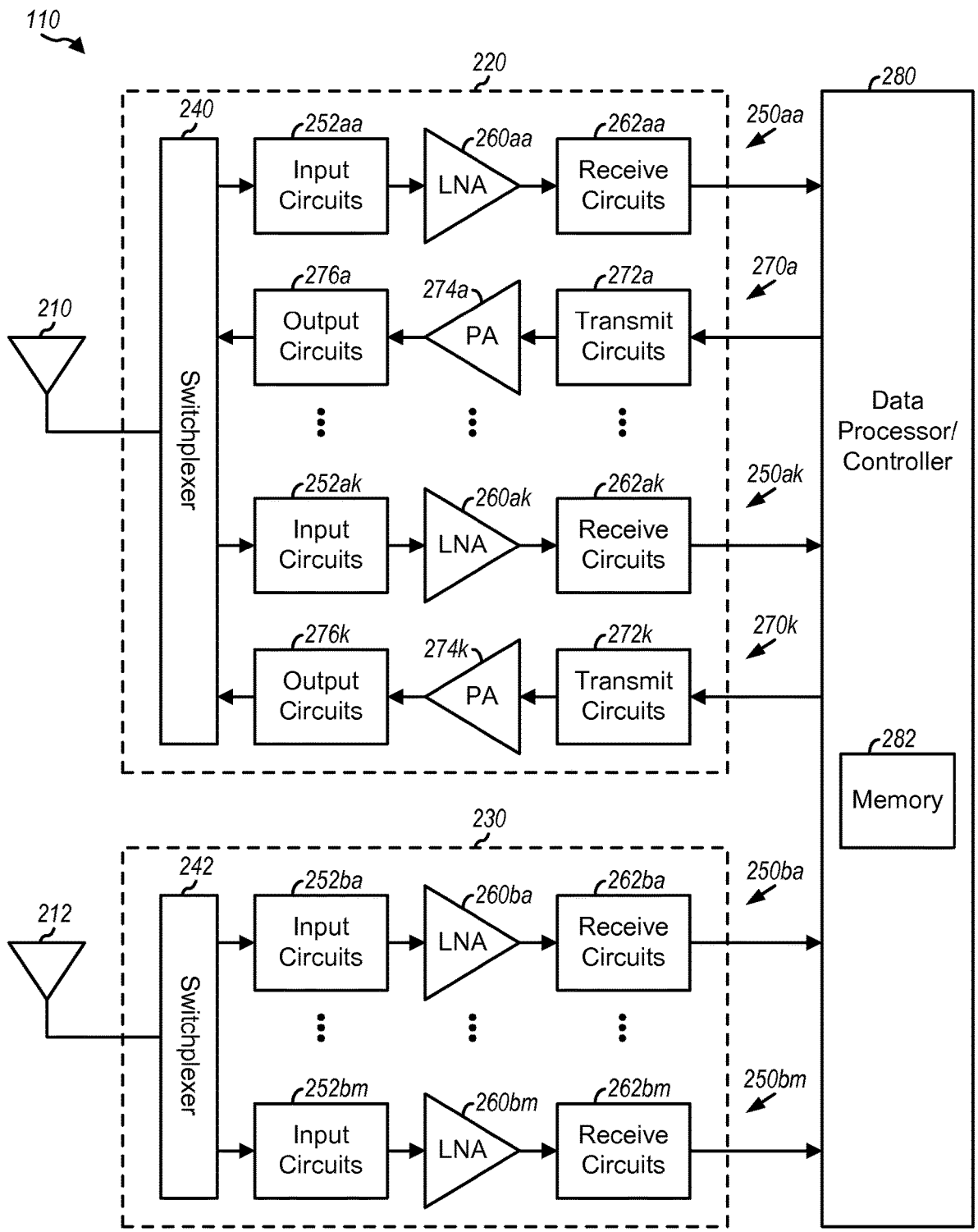
FIG. 2 shows a block diagram of a wireless device.

FIG. 2 shows a block diagram of an exemplary design of wireless device 110 in FIG. 1. In this exemplary design, wireless device 110 includes a transceiver 220 coupled to a primary antenna 210, receivers 230 coupled to a secondary antenna 212, and a data processor/controller 280. Transceiver 220 includes multiple (K) receivers 250aa to 250ak and multiple (K) transmitters 270a to 270k to support multiple frequency bands, multiple radio technologies, carrier aggregation, etc. Receivers 230 include multiple (M) receivers 250ba to 250bm to support multiple frequency bands, multiple radio technologies, receive diversity, multiple-input multiple-output (MIMO) transmission, carrier aggregation, etc.

In the exemplary design shown in FIG. 2, each receiver 250 includes input circuits 252, an LNA 260, and receive circuits 262. For data reception, antenna 210 receives signals from base stations and/or other transmitter stations and provides a received RF signal, which is routed through a switchplexer 240 and provided to a selected receiver. The description below assumes that receiver 250aa is the selected receiver. Within receiver 250aa, the received RF signal is passed through input circuits 252aa and provided to an LNA 260*aa*. Input circuits 252*aa* may include a receive filter, an impedance matching circuit, a duplexer, etc. LNA 260*aa* amplifies the received RF signal from input circuits 252*aa* and provides an amplified RF signal. Receive circuits 262*aa* amplify, filter, and downconvert the amplified RF signal from RF to baseband and provide an analog input signal to data processor 280. Receive circuits 252*aa* may include amplifiers, filters, mixers, impedance matching circuits, an oscillator, a local oscillator (LO) generator, a phase locked loop (PLL), etc. Each remaining receiver 250 in transceiver 220 and each receiver 250 in receivers 230 may operate in similar manner as receiver 250*aa* in transceiver 220.

In the exemplary design shown in FIG. 2, each transmitter 270 includes transmit circuits 272, a power amplifier (PA) 274, and output circuits 276. For data transmission, data processor 280 processes (e.g., encodes and modulates) data to be transmitted and provides an analog output signal to a selected transmitter. The description below assumes that transmitter 270*a* is the selected transmitter. Within transmitter 270*a*, transmit circuits 272*a* amplify, filter, and upconvert the analog output signal from baseband to RF and provide a modulated RF signal. Transmit circuits 272*a* may include amplifiers, filters, mixers, impedance matching circuits, an oscillator, a LO generator, a PLL, etc. A PA 274*a* receives and amplifies the modulated RF signal and provides an amplified signal having the proper output power level. The amplified signal is passed through output circuits 276*a*, routed through switchplexer 240, and transmitted via antenna 210. Output circuits 276*a* may include a transmit filter, an impedance matching circuit, a directional coupler, a duplexer, etc.

FIG. 2 shows an exemplary design of receivers 250 and transmitters 270. A receiver and a transmitter may also include other circuits not shown in FIG. 2, such as filters, impedance matching circuits, etc. All or a portion of transceiver 220 and receivers 230 may be implemented on one or more analog integrated circuits (ICs), RF ICs (RFICs), mixed-signal ICs, etc. For example, LNAs 260, receive circuits 262, and transmit circuits 272 may be implemented on one module, which may be an RFIC, etc. Switchplexers 240 and 242, input circuits 252, output circuits 276, and PAs 274 may be implemented on another module, which may be a hybrid module, etc. The circuits in receivers 250 and transmitters 270 may also be implemented in other manners.

Data processor/controller 280 may perform various functions for wireless device 110. For example, data processor 280 may perform processing for data being received via receivers 250 and transmitted via transmitters 270. Controller 280 may control the operation of switchplexer 240 and/or 242, input circuits 252, LNAs 260, receive circuits 262, transmit circuits 272, PAs 274, output circuits 276, or a combination thereof. A memory 282 may store program codes and data for data processor/controller 280. Data processor/controller 280 may be implemented on one or more application specific integrated circuits (ASICs) and/or other ICs.

It may be desirable to implement the circuits for receivers on a wireless device in multiple modules. A module is a unit that can include any circuits and further includes I/O ports via which signals can be transmitted and received by the circuits in the module. For example, a module may be an IC die/chip (e.g., an RFIC), an IC package, a hybrid module, a circuit card, etc. A module may comprise a single component such as an IC die/chip. A module may also comprise an assembly of components. For example, a hybrid module may include a circuit board, a housing or an enclosure, and one or more I/O ports (e.g., RF connectors). The circuit board may comprise an alumina substrate or some other substrate and may include passive and/or active devices such as inductors, resistors, discrete transistors, IC dies, etc. As another example, a module may include one or more IC dies mounted on a passive substrate, which may be composed of organic or non-organic material. The passive substrate may include interconnect traces, printed passive circuit components/elements (e.g., inductors), and discrete circuit components (e.g., capacitors, inductors, resistors, etc). A hybrid module may include circuits of one or more technologies, such as discrete field effect transistors (FETs) and/or IC dies attached to a circuit board containing interconnection traces. A front-end module is a module that includes circuits (e.g., switchplexer, filter, duplexer, amplifiers, impedance matching circuits, etc.) located close to an antenna for transmitters and/or receivers. A module may comprise different circuit components but may be treated as a single component. A module may be implemented on a closed or an opened package. Some examples of modules include a front-end module, a power amplifier module (PAM), and a system-in-a-package (SiP) module. A front-end module may be a hybrid module, an IC die, an IC package, etc. Different modules may be implemented in different manners and may be more suitable and economical for different circuits. For example, a hybrid module may be more suitable for filters, impedance matching circuits, micro-electro-mechanical systems (MEMS) switches, etc. An IC die may be more suitable for semiconductor circuits such as amplifiers, semiconductor switches, etc.

A module may be associated with various characteristics. For example, a module may be associated with its own power supply and circuit ground connections. A module may also be treated as a single unit during circuit design and manufacturing.

Figure 3:
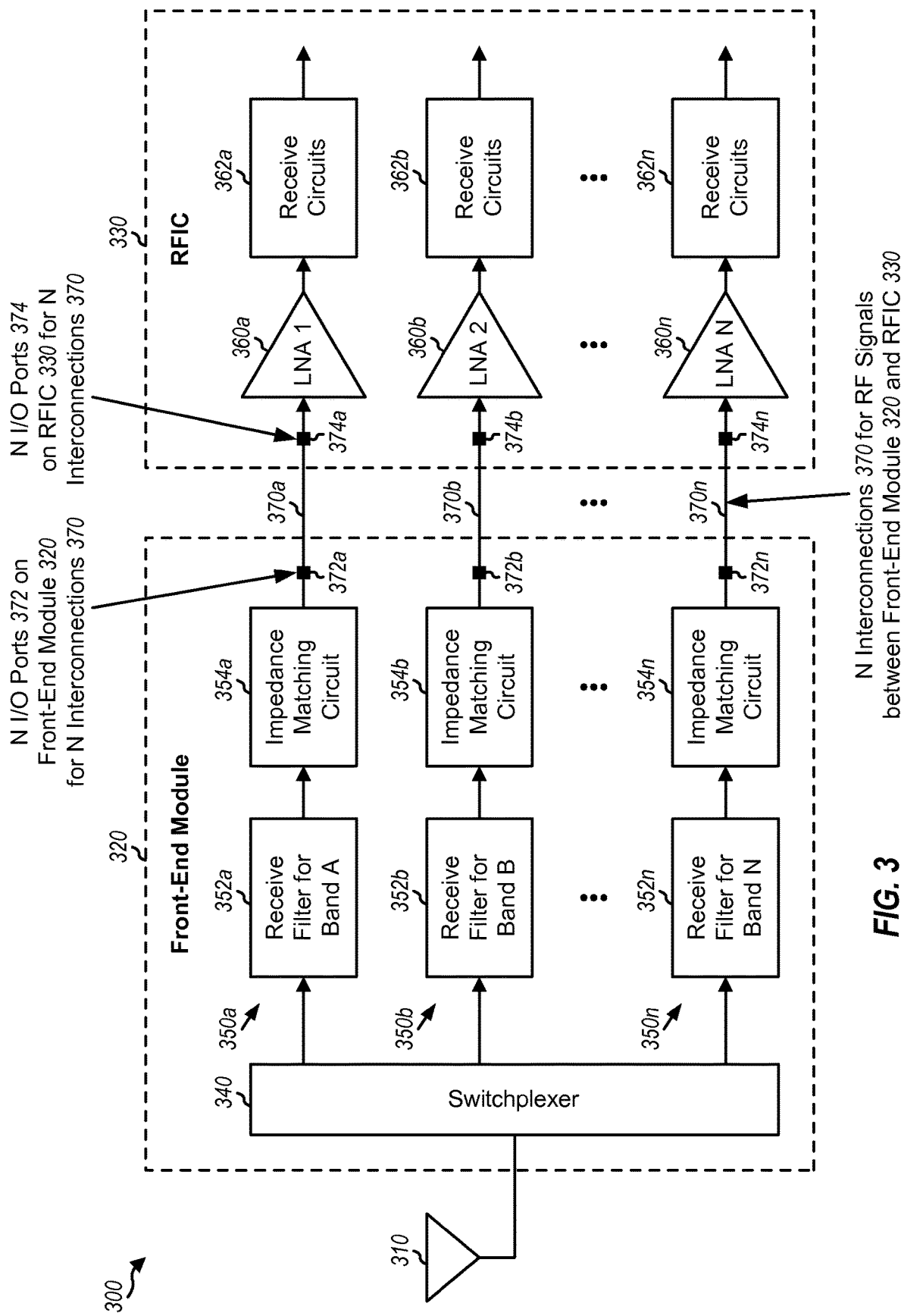
FIG. 3 shows a receive portion of a wireless device.

FIG. 3 shows an exemplary design of a receive portion 300 of a wireless device. In the exemplary design shown in FIG. 3, receive portion 300 includes (i) a front-end module 320 coupled to an antenna 310 and (ii) an RFIC 330 coupled to front-end module 320. Receive portion 300 also include multiple (N) receivers 350*a* to 350*n* implemented on front-end module 320 and RFIC 330. Receivers 350*a* to 350*n* may cover N different frequency bands, as shown in FIG. 3. Receivers 350 may also cover different radio technologies, different functions (e.g., carrier aggregation), etc.

In the exemplary design shown in FIG. 3, each receiver 350 includes a receive filter 352, an impedance matching circuit 354, an LNA 360, and receive circuits 362. Receive filter 352 and impedance matching circuit 354 reside in front-end module 320, and LNA 360 and receive circuits 362 reside in RFIC 330. Receive filter 352 and impedance matching circuit 354 may be part of input circuits 252 in FIG. 2. Receive filter 352 filters a received RF signal to pass signal components in a receive frequency band of interest and to attenuate signal components in a transmit frequency band. Impedance matching circuit 354 performs impedance matching between an output impedance of receive filter 352 and an input impedance of LNA 360. LNA 360 amplifies the received RF signal and provides an amplified RF signal. Receive circuits 362 amplify, filter, and downconvert the amplified RF signal from RF to baseband and provide an analog input signal to a data processor (not shown in FIG. 3).

As shown in FIG. 3, multiple receive filters 352, multiple impedance matching circuits 354, multiple LNAs 360, and multiple receive circuits 362 may be used to support multiple frequency bands. Receive filters 352 and impedance matching circuits 354 may be implemented on front-end module 320, which may be a hybrid module. LNAs 360 and receive circuits 362 may be implemented on RFIC 330. Each receiver 350 for a frequency band may then include a receive filter 352 and an impedance matching circuit 354 on front-end module 320 and an LNA 360 and receive circuits 362 on RFIC 330.

The N LNAs 360a to 360n in RFIC 330 may be connected to the N impedance matching circuits 354a to 354n in front-end module 320 via N interconnections 370a to 370n, one interconnection 370 for each LNA 360. Each interconnection 370 is between one I/O port 372 on front-end module 320 and one I/O port 374 in RFIC 330. N I/O ports 372a to 372n on front-end module 320 and N I/O ports 374a to 374n on RFIC 330 may be used for the N interconnections 370a to 370n between front-end module 320 and RFIC 330. There may be many interconnections 370 between front-end module 320 and RFIC 330 if a wireless device supports a number of frequency bands and/or a number of radio technologies. There may also be many I/O ports 372 on front-end module 320 and also many I/O ports 374 on RFIC 330 to support the many interconnections between these two modules.

In an aspect, LNAs with combined outputs may be used in order to reduce the number of interconnections between modules implementing receivers in a wireless device. The LNAs may be implemented on a front-end module and may be coupled directly to receive filters. Receive circuits may be implemented on an RFIC. The outputs of the LNAs may be combined. A single interconnection between the front-end module and the RFIC may then be used for all LNAs whose outputs are combined. Combining the LNA outputs may greatly reduce the number of interconnections between the modules as well as the number of I/O ports on each module. Combining the LNA outputs may also reduce circuitry, circuit area, and cost and may also provide other benefits such as improved performance.

Figure 4:
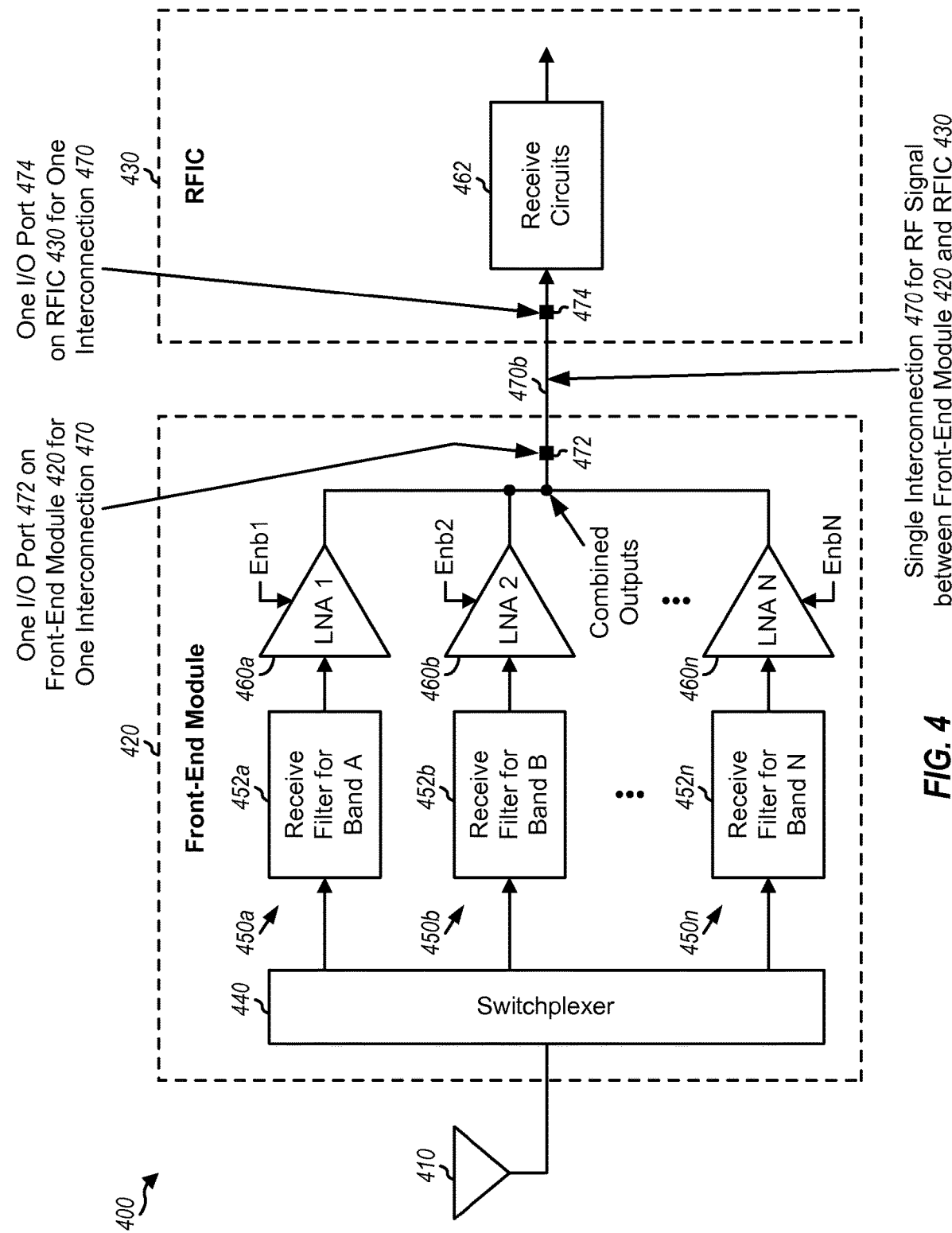
FIG. 4 shows a receive portion including LNAs with combined outputs.

FIG. 4 shows an exemplary design of a receive portion 400 of a wireless device, e.g., wireless device 110 in FIG. 1. In the exemplary design shown in FIG. 4, receive portion 400 includes (i) a front-end module 420 coupled to an antenna 410 and (ii) an RFIC 430 coupled to front-end module 420. Receive portion 400 also include multiple (N) receivers 450a to 450n implemented on front-end module 420 and RFIC 430. Receivers 450a to 450n may cover N different frequency bands, as shown in FIG. 4. Receivers 450a to 450n may also cover different radio technologies, different functions, etc. Receivers 450a to 450n may be used for receivers 250aa to 250ak for primary antenna 210 in FIG. 2, with N=K. Receivers 450a to 450n may also be used for receivers 250ba to 250bm for secondary antenna 212 in FIG. 2, with N=M.

In the exemplary design shown in FIG. 4, each receiver 450 includes a receive filter 452, and an LNA 460. The N receivers 450a to 450n share receive circuits 462. Receive filter 452 and LNA 360 reside on front-end module 420, and receive circuits 462 reside on RFIC 430. For each receiver 450, receive filter 452 may be part of input circuits 252 in FIG. 2 and may be a surface acoustic wave (SAW) filter or some other type of filter. Receive filter 452 may be (i) a separate receive filter for time division duplexing (TDD) or (ii) part of a duplexer for frequency division duplexing (FDD). Receive filter 452 filters a received RF signal to pass signal components in a receive band and attenuate signal components in a transmit band. In a first exemplary design, receive filter 452 has an output impedance designed to match an input impedance of LNA 460. In a second exemplary design, receive filter 452 has a target output impedance, and impedance matching between receive filter 452 and LNA 460 may not be necessary due to close placement of LNA 460 to receive filter 452. For both the first and second exemplary designs, an impedance matching circuit between receive filter 452 and LNA 460 may be omitted, as shown in FIG. 4. In a third exemplary design, an impedance matching circuit is located between receive filter 452 and LNA 460 and performs impedance matching between the output impedance of receive filter 452 and the input impedance of LNA 460. LNA 460 amplifies the received RF signal and provides an amplified RF signal. Receive circuits 462 amplify, filter, and downconvert the amplified RF signal from RF to baseband and provide an analog input signal to a data processor (e.g., data processor 280 in FIG. 2).

In an exemplary design, receive circuits 462 include common circuits that can be shared by all N receivers 450a to 450n. In this exemplary design, the common circuits may have the same biasing for all frequency bands or different biasing for different frequency bands supported by receivers 450a to 450n. In another exemplary design, receive circuits 462 include separate circuits for each receiver 450 or each subset of receivers 450 of interest. In this exemplary design, the separate circuits for each receiver 450 or each subset of receivers 450 may be designed to provide good performance for one or more frequency bands supported by that receiver or that subset of receivers.

As shown in FIG. 4, multiple receive filters 452 and multiple LNAs 460 may be used to support multiple frequency bands. Receive filters 452 and LNAs 460 may be implemented on front-end module 420, which may be a hybrid module. Receive circuits 462 may be implemented on RFIC 430. Each receiver 450 for a frequency band may then include a receive filter 452 and an LNA 460 on front-end module 420 and receive circuits 462 on RFIC 330. The N LNAs 360a to 360n in RFIC 430 may be connected to receive circuits 462 in front-end module 420 via a single interconnection 470. Interconnection 470 is between an I/O port 472 on front-end module 420 and an I/O port 474 on RFIC 430.

As shown in FIGS. 3 and 4, the number of interconnections between modules as well as the number of I/O ports on each module may be greatly reduced by combining the outputs of LNAs. Furthermore, circuitry may be reduced due to the LNA outputs being combined. In particular, by locating the LNAs on the front-end module instead of the RFIC, impedance matching circuits between the receive filters and the LNAs may be omitted, as shown in FIG. 4. Circuitry may also be reduced by sharing the receive circuits for multiple LNAs, as also shown in FIG. 4.

In an exemplary design, the N LNAs 460a to 460n may be individually enabled or disabled via N enable control signals Enb1 to EnbN, respectively. One LNA 460 for a selected frequency band may be enabled at any given moment, and remaining LNAs 460 may be disabled. In another exemplary design, multiple LNAs may be simultaneously enabled to amplify a received RF signal and provide an amplified RF signal.

In an exemplary design, N LNAs 460a to 460n may be coupled to a common summing node via N switches, which are not shown in FIG. 4. Each LNA 460 may have its output coupled to one end of a switch, and the other end of the switch may be coupled to the common summing node. The switch for each LNA 460 may be opened or closed via a respective enable control signal for that LNA. In another exemplary design, each LNA 460 may be connected to the common summing node when that LNA is enabled or disconnected from the common summing node when the LNA is disabled. Multiple LNAs may also be coupled to a common summing node in other manners.

LNAs with combined outputs may be implemented in various manners. Several exemplary designs of LNAs with combined outputs are described below.

Figure 5:
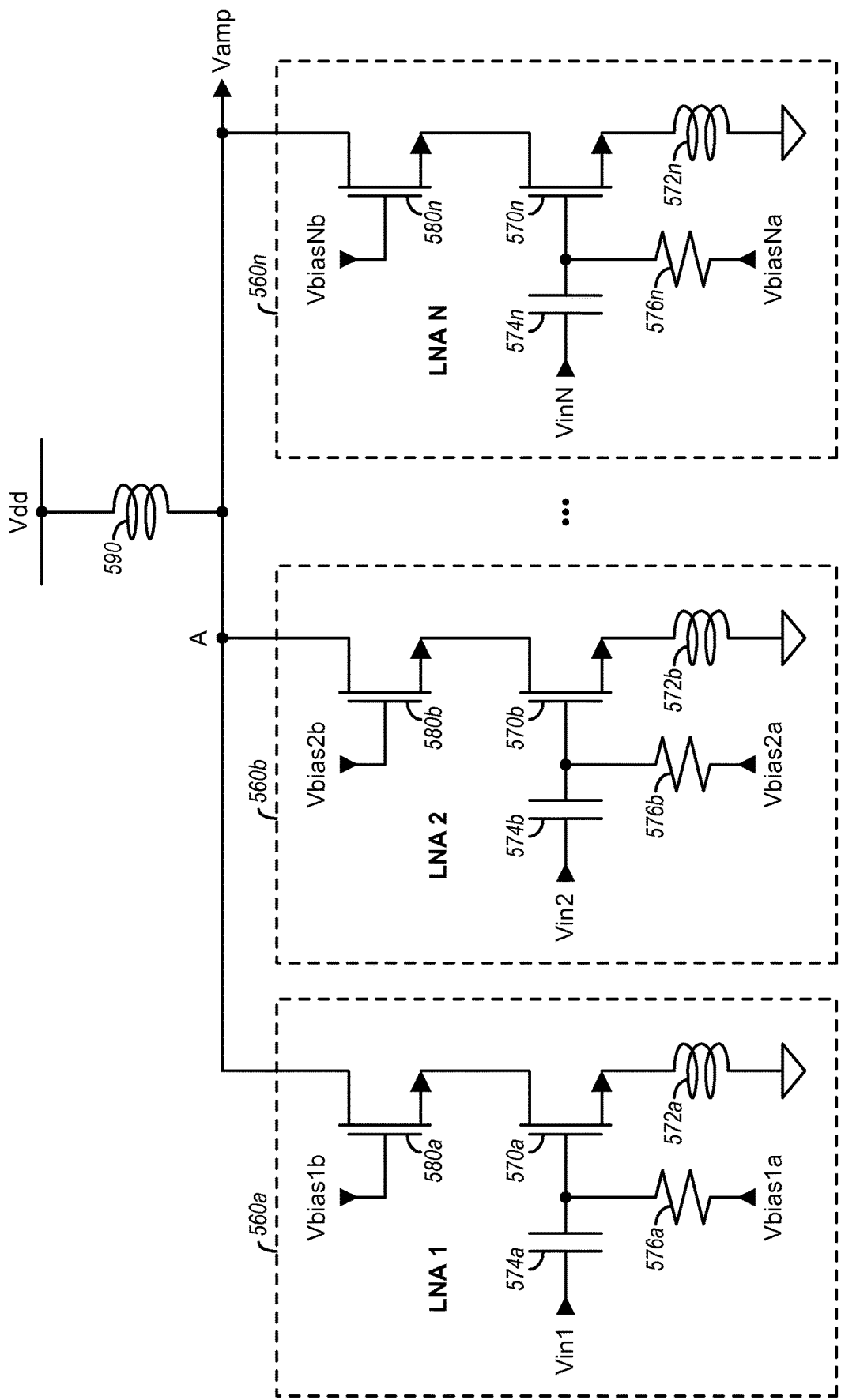
FIGS. 5 and 6 show two exemplary designs of single-ended LNAs with combined outputs.

FIG. 5 shows a schematic diagram of an exemplary design of multiple (N) single-ended LNAs 560a to 560n with combined outputs. LNAs 560a to 560n may be used for LNAs 460a to 460n, respectively, in FIG. 4.

Within LNA 560a, an alternating current (AC) coupling capacitor 574a has one end receiving an input RF signal (Vin1) for LNA 560a and the other end coupled to a gate of an N-channel metal oxide semiconductor (NMOS) transistor 570a. A resistor 576a has one end receiving a first bias voltage (Vbias1a) for LNA 560a and the other end coupled to the gate of NMOS transistor 570a. NMOS transistor 570a has its drain coupled to the source of an NMOS transistor 580a and its source coupled to one end of an inductor 572a. The other end of inductor 572a is coupled to circuit ground. NMOS transistor 580a has its gate receiving a second bias voltage (Vbias1b) for LNA 560a and its drain coupled to a summing node A. NMOS transistor 580a provides an amplified RF signal (Vamp) when LNA 560a is enabled.

Each of the remaining LNAs 560b to 560n may be implemented in similar manner as LNA 560a. Each LNA 560x, where index x∈{a, . . . , n}, includes NMOS transistors 570x and 580x, an inductor 572x, an AC coupling capacitor 574x, and a resistor 576x. For each LNA 560x, NMOS transistor 570x receives an input RF signal for that LNA via capacitor 574x and also receive a first bias voltage for that LNA via resistor 576x. For each LNA 560x, NMOS transistor 580x receives a second bias voltage for that LNA. An inductor 590 is coupled between a power supply voltage (Vdd) and node A. Inductor 590 is a load that is shared by the N LNAs 560a to 560n.

Within each LNA 560x, NMOS transistor 570x and inductor 572x form an input gain stage for an input RF signal. NMOS transistor 570x provide signal amplification for the input RF signal. Inductor 572x provides source degeneration for NMOS transistor 570x to improve the linearity of LNAs 560x. Inductor 572x may further provide input impedance matching looking into the gate of NMOS transistor 570x. NMOS transistor 580x is a cascode transistor that provides load isolation for NMOS transistor 570x and also provides signal drive for an amplified RF signal from LNA 560x. LNA 560x may be enabled or disabled based on the first bias voltage for NMOS transistor 570x and/or the second bias voltage for NMOS transistor 580x. The bias voltages for each LNA 560x may be generated based on an enable control signal for that LNA.

N different input RF signals Vin1 to VinN are provided to N LNAs 560a to 560n, respectively. The input RF signals for LNA 560a to 560n may be provided by N receive filters, e.g., receive filters 452a to 452n in FIG. 4. N first bias voltages Vbias1a to VbiasNa and N second bias voltages Vbias1b to VbiasNb are also provided to N LNAs 560a to 560n.

Figure 6:
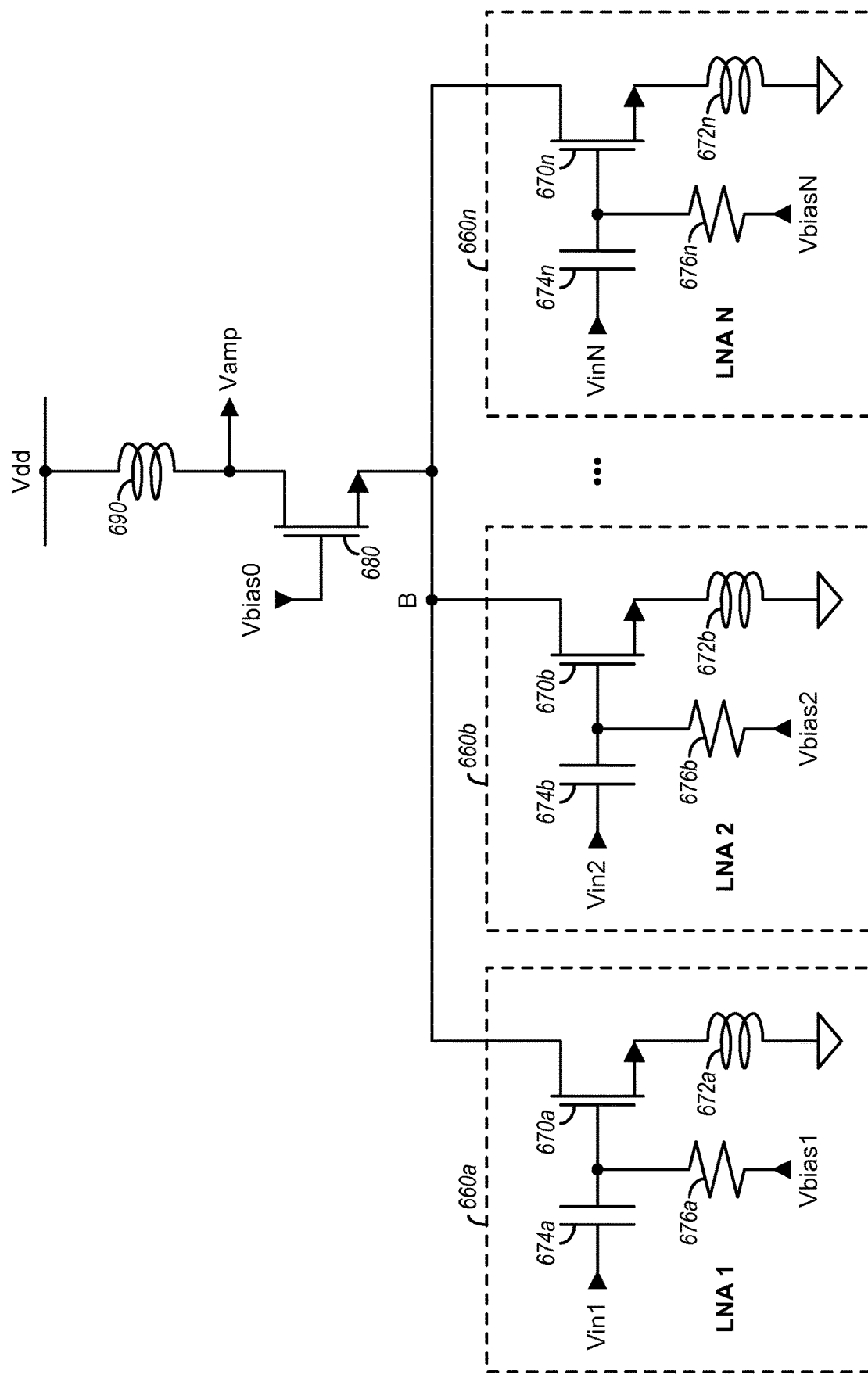

FIG. 6 shows a schematic diagram of an exemplary design of multiple (N) single-ended LNAs 660a to 660n with combined outputs. LNAs 660a to 660n may also be used for LNAs 460a to 460n, respectively, in FIG. 4.

Each LNA 660x, where index x∈{a, . . . , n}, includes an NMOS transistors 670x, a source degeneration inductor 672x, an AC coupling capacitor 674x, and a resistor 676x, which are coupled in the same manner as NMOS transistor 570a, inductor 572a, capacitor 574a, and resistor 576x in LNA 560a in FIG. 5. The drains of NMOS transistors 670a to 670n for the N LNAs 660a to 660n are coupled to a summing node B. An NMOS transistor 680 has its source coupled to summing node B, its gate receiving a bias voltage (Vbias0), and its drain providing an amplified RF signal (Vamp). An inductor 690 has one end coupled to the drain of NMOS transistor 680 and the other end coupled to the Vdd voltage.

For each LNA 660x, NMOS transistor 670x receives an input RF signal (Vin) for that LNA via capacitor 674x and also receive a bias voltage (Vbias) for that LNA via resistor 676x. N different input RF signals Vin1 to VinN are provided to N LNAs 660a to 660n, respectively. N bias voltages Vbias1 to VbiasN are also provided to N LNAs 660a to 660n, respectively.

Within each LNA 660x, NMOS transistor 670x and inductor 672x form an input gain stage. Each LNA 660x may be enabled or disabled based on the bias voltage for that LNA, which may be generated based on an enable control signal for that LNA. NMOS transistor 680 is a common cascode transistor for all N LNAs 660a to 660n. Inductor 690 is a common load inductor for all N LNAs 660a to 660n.

Figure 7:
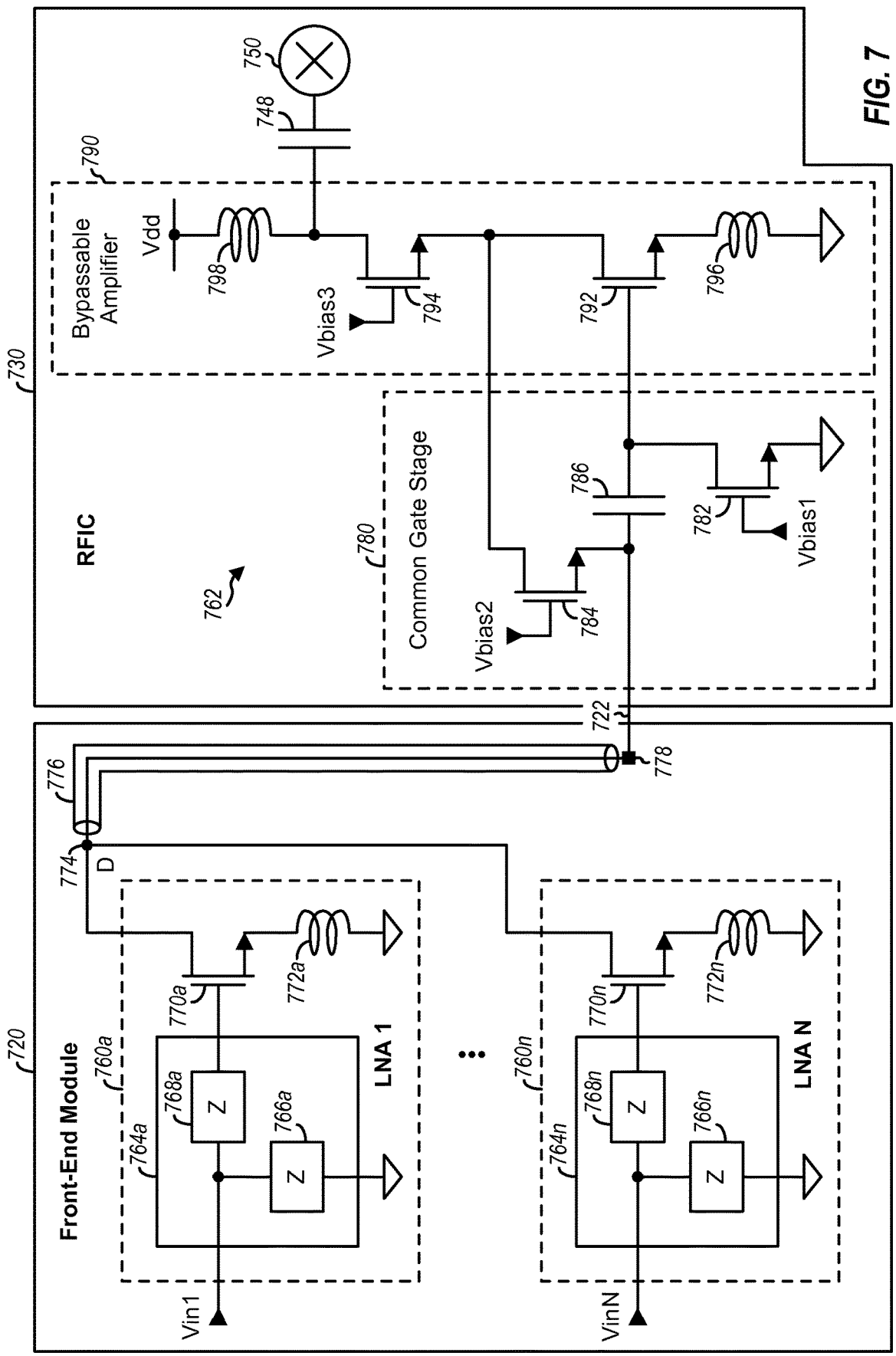
FIG. 7 shows a schematic diagram of an exemplary design of multiple (N) single-ended LNAs with combined outputs.

FIG. 7 shows a schematic diagram of an exemplary design of multiple (N) single-ended LNAs 760a to 760n with combined outputs. LNAs 760a to 760n may also be used for LNAs 460a to 460n, respectively, in FIG. 4. LNAs 760a to 760n are implemented on a front-end module 730 and are coupled to receive circuits 762 on an RFIC 730 via a single interconnection 722.

Each LNA 760x, where index x∈{a, . . . , n}, includes an NMOS transistors 770x and a source degeneration inductor 772x, which are coupled in the same manner as NMOS transistor 570a and inductor 572a in LNA 560a in FIG. 5. Each LNA 760x also includes an input impedance matching circuit 764x comprising (i) a shunt circuit component 766x coupled between the input of LNA 760x and circuit ground and (ii) a series circuit component 768x coupled between the input of LNA 760x and the gate of NMOS transistor 770x. Circuit components 764x and 766x may each be an inductor or a capacitor. The drains of NMOS transistors 770a to 770n for LNAs 760a to 760n, respectively, are coupled to a summing node D. A transmission line 776 is coupled between summing node D and an I/O port 778 on front-end module 720.

For each LNA 760x, NMOS transistor 770x receives an input RF signal (Vin) for that LNA. N different input RF signals Vin1 to VinN are provided to N LNAs 760a to 760n, respectively. Each LNA 760x may be enabled or disabled based on the bias voltage for that LNA (not shown in FIG. 7). The N LNAs 760a to 760n on front-end module 720 have a current mode interface to receive circuits 762 on RFIC 730.

Receive circuits 762 include a common gate stage 780, a bypassable amplifier 790, an AC coupling capacitor 748, and a mixer 750. Amplifier 790 includes NMOS transistors 792 and 794, a source degeneration inductor 796, and a load inductor 798, which are coupled in similar manner as NMOS transistors 570a and 580a and inductor 572a and 590 in FIG. 5. Load inductor 798 may be replaced with an active load composed of one or more MOS transistors. Common gate stage 780 includes NMOS transistors 782 and 784 and an AC coupling capacitor 786. NMOS transistor 782 has its source coupled to circuit ground, its gate receiving a first bias voltage (Vbias1), and its drain coupled to the gate of NMOS transistor 792. NMOS transistor 784 has its source coupled to the input of receive circuits 762, its gate receiving a second bias voltage (Vbias2), and its drain coupled to the drain of NMOS transistor 792. Capacitor 786 is coupled between the input of receive circuits 762 and the gate of NMOS transistor 792. In general, a common gate stage includes a transistor (e.g., NMOS transistor 784) having its gate coupled to AC ground, its source receiving an input signal, and its drain providing an output signal.

Common gate stage 780 on RFIC 730 supplies bias current to LNAs 760a to 760n on front-end module 720. Amplifier 790 may be bypassed by turning off NMOS transistor 792 via NMOS transistor 782. In particular, NMOS transistor 792 may be turned off by pulling its gate to a low voltage (e.g., to 0 Volts), which may be achieved by applying a high bias voltage at the gate of NMOS transistor 782. NMOS transistor 784 may be turned on and may operate as switch. As a result, the bias current of NMOS transistor 794 may be routed to NMOS transistor 770 in a selected/enabled LNA 760. An output signal from NMOS transistor 770 in the selected LNA 760 may be routed via NMOS transistor 784 to NMOS transistor 794. A cascode amplifier may be formed by NMOS transistors 770 and 794 (instead of NMOS transistors 792 and 794). Impedance matching to transmission line 776 may be achieved via the input impedance of common gate stage 780 and the ON resistance of NMOS transistor 784, which operates as a switch.

The exemplary design in FIG. 7 may provide various advantages. First, LNAs 760 may be implemented in a smaller circuit area since a load inductor may be omitted. Second, mixer 750 may be isolated from front-end module 720 via common gate stage 780. Third, LNAs 760a to 760n are implemented with a common source circuit design and have good noise figure. Fourth, the circuit design in FIG. 7 may allow for easier implementation of bypassable amplifier 790 on RFIC 730.

Figure 8:
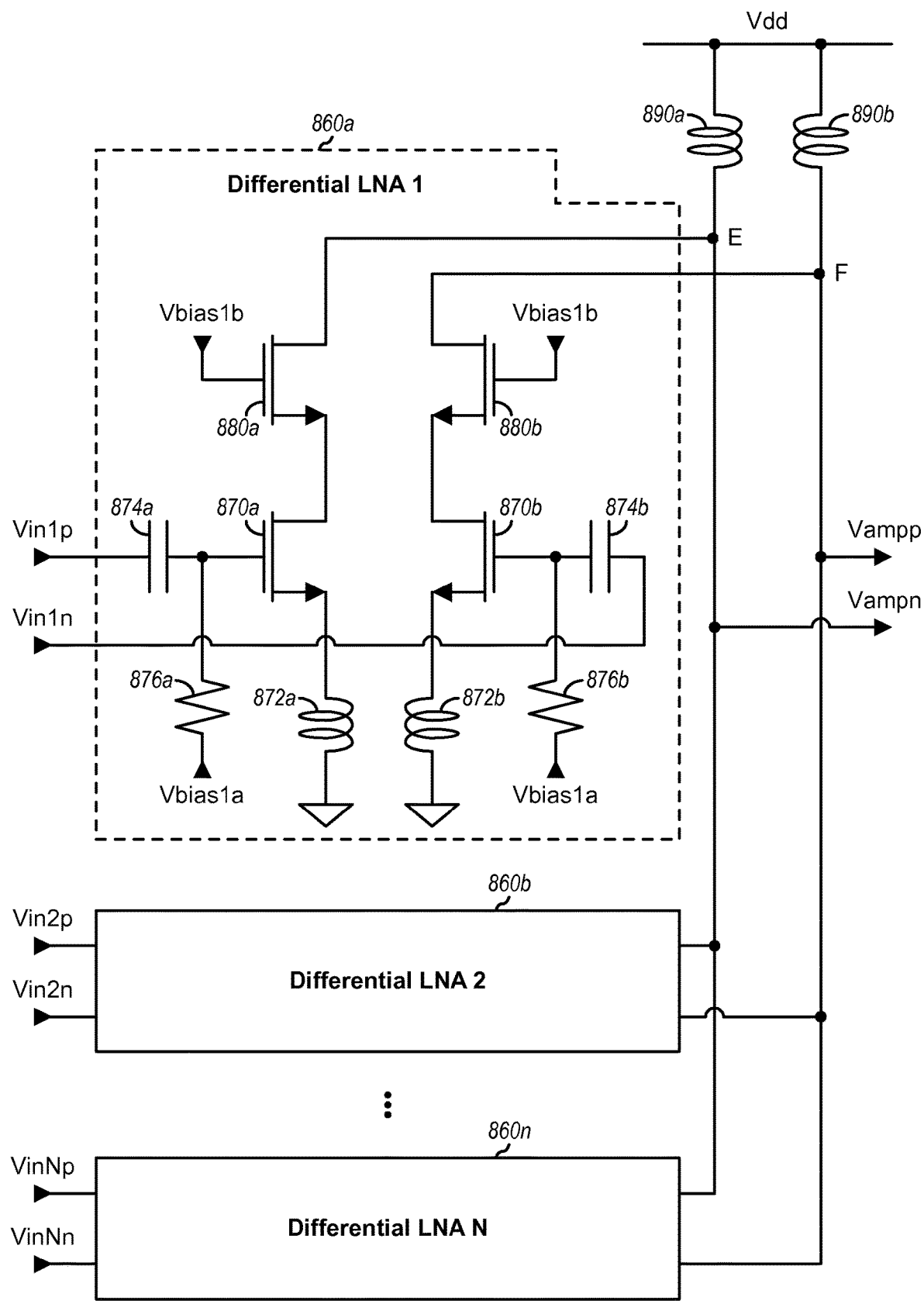
FIG. 8 shows an exemplary design of differential LNAs with combined outputs.

FIG. 8 shows a schematic diagram of an exemplary design of multiple (N) differential LNAs 860a to 860n with combined outputs. LNAs 860a to 860n may also be used for LNAs 460a to 460n, respectively, in FIG. 4.

LNA 860a includes NMOS transistors 870a and 880a, an inductor 872a, a capacitor 874a, and a resistor 876a that are coupled in the same manner as NMOS transistors 570a and 580a, inductor 572a, capacitor 574a, and resistor 576a in FIG. 5. LNA 860a also includes NMOS transistors 870b and 880b, an inductor 872b, a capacitor 874b, and a resistor 876b that are also coupled in the same manner as NMOS transistors 570a and 580a, inductor 572a, capacitor 574a, and resistor 576a in FIG. 5. LNA 860a receives a differential input RF signal composed of a Vin1p signal and a Vin1n signal. The Vin1p signal is provided to capacitor 874a, and the Vin1n signal is provided to capacitor 874b. The drain of NMOS transistor 880a is coupled to a first summing node E, and the drain of NMOS transistor 880b is coupled to a second summing node F. An inductor 890a is coupled between node E and the Vdd voltage. An inductor 890b is coupled between node F and the Vdd voltage.

Each of the remaining LNAs 860b to 860n may be implemented in similar manner as LNA 860a. N differential input RF signals are provided to N LNAs 860a to 860n. Each differential input RF signal includes (i) a non-inverting input RF signal (e.g., Vin1p) provided to a first NMOS transistor in an associated LNA 860 and (ii) an inverting input RF signal (e.g., Vin1n) provided to a second NMOS transistor in the associated LNA 860. A differential amplified RF signal composed of a Vampp signal and a Vampn signal is provided via nodes E and F.

Differential LNAs 860a to 860n in FIG. 8 are based on single-ended LNAs 560a to 560n in FIG. 5. Differential LNAs may also be implemented based on single-ended LNAs 660a to 660n in FIG. 6.

FIGS. 5 to 8 show three exemplary designs of LNAs with combined outputs. LNAs with combined outputs may also be implemented in other manners. For example, a gain transistor may be implemented with multiple NMOS transistors coupled in parallel. A load inductor may be replaced with an active load, which may be implemented with P-channel metal oxide semiconductor (PMOS) transistors or some other type of transistors.

LNAs 560a to 560n in FIG. 5, LNAs 660a to 660n in FIG. 6, and LNAs 860a to 860n in FIG. 8 may be designed to provide good performance for their associated frequency bands. For example, the size of the NMOS transistors, the bias voltage and/or the bias current for the NMOS transistors, the value of the source degeneration inductor, and/or other characteristics of each LNA may be designed to provide good performance at the frequency band supported by that LNA. Different LNAs may have different transistor sizes, differential biasing (e.g., different bias voltages and/or different bias currents), different source inductances, etc.

Although not shown in FIGS. 5 to 8, a capacitor may be coupled in parallel with a load inductor, e.g., inductor 590 in FIG. 5, inductor 690 in FIG. 6, or each of inductors 890a and 890b in FIG. 8. The load inductor and the capacitor would form a resonator circuit having a resonant frequency. The capacitor may be adjustable/variable, and the resonant frequency may be adjusted by varying the capacitance of the capacitor. The resonant frequency may be set to a frequency band of interest. An adjustable capacitor may enable load tuning across different frequency bands supported by the N LNAs sharing the load inductor.

A wireless device may require a complex RF front-end due to proliferation of frequency bands and operating modes. Conventionally, PAs, duplexers, filters, and switches are implemented with discrete components. LNAs are typically located in a transceiver (e.g., an RFIC), and PAs are typically stand-alone. LNAs and PAs are typically separated from their associated filters and duplexers. Hence, many RF routing traces and impedance matching components are typically required between the filters and/or duplexers and their associated LNAs and PAs. Large board area is typically consumed by discrete PAs, discrete filters and/or duplexers, and interconnections between the filters and/or duplexers and their associated LNAs and PAs.

In another aspect, a more compact wireless device may be achieved by combining LNAs, PAs, duplexers, filters, and switches in one or more modules. LNAs and PAs may be monolithically integrated on the same IC die or may be implemented on different IC dies in the same package. Switches may be monolithically integrated with the LNAs and/or PAs or may be implemented on different IC dies in the same package. Combining LNAs, PAs, duplexers, filters, and switches may reduce interconnections, avoid impedance matching components, reduce board area, and possibly provide other benefits.

Figure 9:
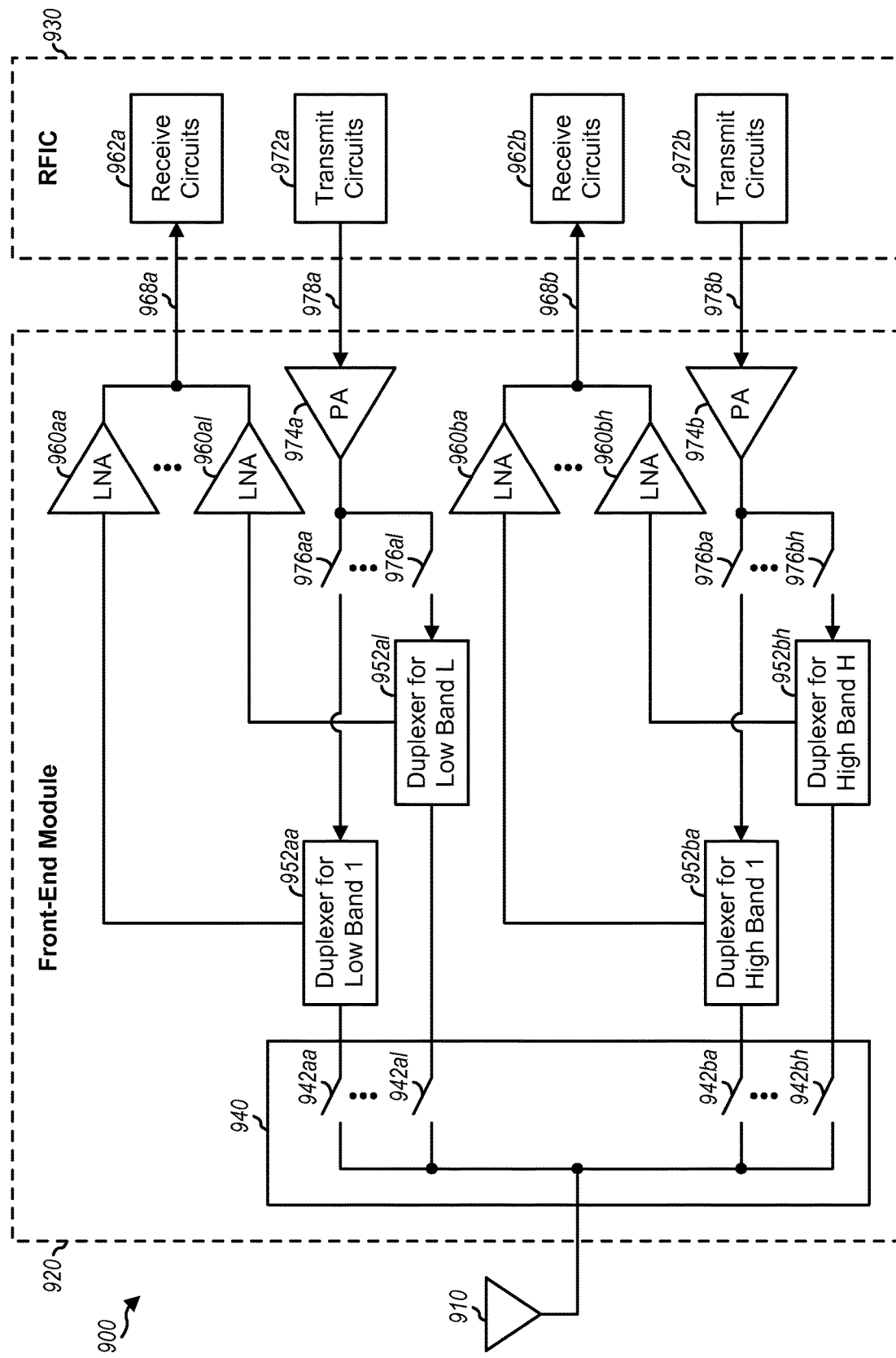
FIG. 9 shows a transceiver including LNAs with combined outputs.

FIG. 9 shows an exemplary design of a transceiver 900 for a wireless device. In the exemplary design shown in FIG. 9, transceiver 900 includes (i) a front-end module 920 coupled to an antenna 910 and (ii) an RFIC 930 coupled to front-end module 920. Transceiver 900 also includes (i) L receivers and L transmitters for low band and (ii) H receivers and H transmitters for high band, all of which are implemented on front-end module 920 and RFIC 930, where L and H may each be any integer value. The L receivers for low band may cover different frequency bands and/or different radio technologies for low band. The H receivers for high band may cover different frequency bands and/or different radio technologies for high band.

In the exemplary design shown in FIG. 9, each receiver for low band includes a duplexer 952, an LNA 960, and receive circuits 962. In the receiver for low band 1, a duplexer 952aa has its output port coupled to one end of a switch 942aa within a switchplexer 940 and its receive port coupled to the input of an LNA 960aa. Each remaining receiver for low band is connected in similar manner as the receiver for low band 1. The outputs of the L LNAs 960aa to 960al for low band are connected together and coupled via an interconnection 968a to receive circuits 962a on RFIC 930. Each receiver for high band is connected in similar manner as each receiver for low band. The outputs of the H LNAs 960ba to 960bh for high band are connected together and coupled via an interconnection 968b to receive circuits 962b on RFIC 930.

In the exemplary design shown in FIG. 9, each transmitter for low band includes transmit circuits 972, a PA 974, and duplexer 952. In the transmitter for low band 1, a PA 974a has its input connected via an interconnection 978a to transmit circuits 962a on RFIC 930. PA 974aa has its output connected to a transmit port of duplexer 952aa via a switch 976aa. Each remaining transmitter for low band is connected in similar manner as the transmitter for low band 1. Each transmitter for high band is also connected in similar manner as each transmitter for low band. The input of a PA 974b for high band is coupled via an interconnection 978b to transmit circuits 972b on RFIC 930.

As shown in FIG. 9, the number of RF connections between front-end module 920 and RFIC 930 as well as the number of I/O ports on each of front-end module 920 and RFIC 930 may be substantially reduced by combining the outputs of LNAs. Combining the LNA outputs may be especially advantageous when there are many LNAs for many frequency bands and/or many radio technologies. Furthermore, impedance matching circuits between duplexers 952 and LNAs 960 may be omitted by placing the LNAs close to the duplexers.

FIG. 9 shows an exemplary design of transceiver 900 for FDD. In this case, a duplexer 952 is shared by a receiver and a transmitter. A duplexer includes a transmit filter and a receive filter integrated on one package. For TDD, a PA may be coupled directly to a switchplexer without going through a duplexer, and an LNA may be coupled to a receive filter instead of a duplexer.

The exemplary design in FIG. 9 shows various features of the present disclosure. First, the outputs of multiple LNAs on one module may be combined and coupled via a single interconnection to receive circuits on another module. Alternatively, the inputs of multiple LNAs may also be combined, and the outputs of the LNAs may be coupled via switches to a single interconnection. Second, a front-end module may include LNAs with combined outputs as well as one or more PAs, one or more receive filters, one or more transmit filters, one or more duplexers, or a combination thereof. A PA may support multiple frequency bands and/or multiple modes of operation and may be coupled to switches to select a particular frequency band and/or a particular mode, as shown in FIG. 9. A PA may have its input coupled to common transmit circuits for multiple frequency bands and/or multiple modes and may have its output coupled to multiple transmit paths (e.g., duplexers) for different frequency bands and/or different modes.

FIGS. 4 and 9 show two exemplary designs of a front-end module with multiple sets of LNAs and receive filters/duplexers, where the LNA outputs are combined at a common load. This allows multiple sets of LNAs and receive filters/duplexers to be connected to a single interconnection. The LNAs may be coupled directly to the receive filters/duplexers without going through impedance matching circuits, as shown in FIGS. 4 and 9. The LNAs with combined outputs may be used for primary receivers coupled to a primary antenna as well as for secondary receivers (e.g., diversity receivers) coupled to a secondary antenna.

In an exemplary design, an apparatus (e.g., a wireless device, an IC, a circuit module, etc.) may comprise a front-end module and an IC. The front-end module (e.g., front-end module 420 in FIG. 4) may comprise a plurality of LNAs (e.g., LNAs 460a to 460n in FIG. 4) having outputs that are combined. The IC (e.g., RFIC 430 in FIG. 4) may comprise receive circuits (e.g., receive circuits 462) coupled to the plurality of LNAs via a single interconnection (e.g., interconnection 470 in FIG. 4). In an exemplary design, the front-end module may comprise a hybrid module including circuit components of different technologies. In an exemplary design, the IC may comprise an RFIC. The front-end module and the IC may also comprise modules of other types. The single interconnection may be associated with a single I/O port on the front-end module, a single I/O port on the IC for a single-ended design, and a single RF routing trace between these I/O ports, e.g., as shown in FIG. 5. Alternatively, the single interconnection may be associated with two I/O ports on the front-end module, two I/O ports on the IC, and two RF routing traces between the two I/O ports on the front-end module and the two I/O ports on the IC for a differential LNA design.

In an exemplary design, each of the plurality of LNAs may be enabled for disabled via a respective control signal for that LNA, e.g., as shown in FIG. 4. A subset (e.g., one) of the plurality of LNAs may be enabled at any given moment, and remaining ones of the plurality of LNAs may be disabled.

In an exemplary design, the front-end module may comprise at least one receive filter (e.g., filters 452a to 452n in FIG. 4) coupled to at least one of the plurality of LNAs. At least one of the plurality of LNAs may be coupled directly to the at least one receive filter, without going through an impedance matching circuit, as shown in FIG. 4. The at least one receive filter may be part of at least one duplexer, e.g., as shown in FIG. 9. The front-end module may further comprise a switchplexer (e.g., switchplexer 440 in FIG. 4) coupled to the at least one receive filter. The front-end module may also comprise other circuit components.

In an exemplary design, each of the plurality of LNAs may comprise a first transistor and a second transistor, e.g., as shown in FIG. 5. The first transistor (e.g., NMOS transistor 570a in FIG. 5) may have a gate receiving an input RF signal. The second transistor (e.g., NMOS transistor 580a in FIG. 5) may have a drain coupled to a summing node (e.g., node A in FIG. 5) and a source coupled to a drain of the first transistor.

In another exemplary design, each of the plurality of LNAs may comprise a first transistor (e.g., NMOS transistor 670a in FIG. 6 or NMOS transistor 760a in FIG. 7) having a gate receiving an input RF signal and a drain coupled to a summing node (e.g., node B in FIG. 6 or node D in FIG. 7). In an exemplary design, the plurality of LNAs may further comprise a second transistor (e.g., NMOS transistor 680 in FIG. 6) having a source coupled to the summing node and a drain providing an amplified RF signal. In another exemplary design, the summing node may be coupled via a current interface to the receive circuits, e.g., as shown in FIG. 7. The receive circuits may comprise a common gate stage and an amplifier. The common gate stage (e.g., common gate stage 780 in FIG. 7) may provide bias current for the plurality of LNAs. The amplifier (e.g., amplifier 790 in FIG. 7) may be coupled to the common gate stage and may be bypassable via the common gate stage.

In one exemplary design, each LNA may be a single-ended LNA receiving a single-ended input RF signal and providing a single-ended amplified RF signal, e.g., as shown in FIGS. 5 and 6. In another exemplary design, each LNA may be a differential LNA receiving a differential input RF signal and providing a differential amplified RF signal, e.g., as shown in FIG. 8.

In an exemplary design, the plurality of LNAs may comprise a load inductor (e.g., inductor 590 in FIG. 5) shared by the plurality of LNAs. The plurality of LNAs may further comprise an adjustable capacitor coupled in parallel with the load inductor. The plurality of LNAs may be associated with different transistor sizes, different transistor biasing, different LNA circuit designs, some other different characteristics, or a combination thereof.

In an exemplary design, the plurality of LNAs (e.g., LNAs 960aa to 960al in FIG. 9) may be for low band. The front-end module may further comprise a second plurality of LNAs (e.g., LNAs 960ba to 960bh in FIG. 9) for high band and having outputs that are combined. The IC may further comprise second receive circuits (e.g., receive circuits 962b) coupled to the second plurality of LNAs via a second interconnection.

In an exemplary design, the front-end module may further comprise at least one power amplifier (e.g., PA 974a and/or 974b in FIG. 9). The IC may further comprise transmit circuits (e.g., transmit circuits 972a and/or 972b in FIG. 9) coupled to the at least one power amplifier. The front-end module may further comprise a plurality of transmit filters or a plurality of duplexers for a plurality of frequency bands, e.g., as shown in FIG. 9. The at least one power amplifier may include a power amplifier supporting the plurality of frequency bands and coupled to the plurality of transmit filters or the plurality of duplexers via a plurality of switches, e.g., as shown in FIG. 9.

Figure 10:
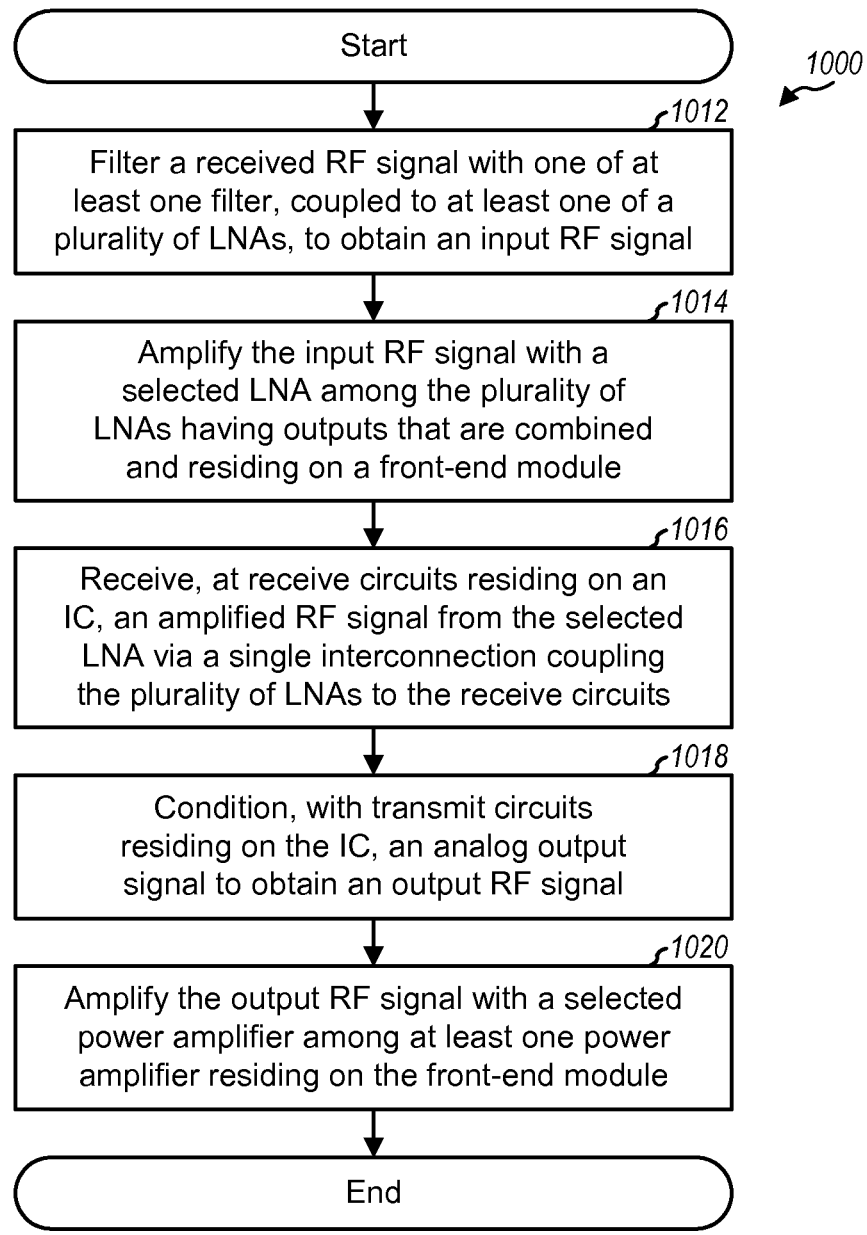
FIG. 10 shows a process for amplifying an input RF signal.

FIG. 10 shows an exemplary design of a process 1000 for performing signal amplification. A received RF signal may be filtered with one of at least one filter to obtain an input RF signal (block 1012). The at least one filter may be coupled to at least one of a plurality of LNAs. The input RF signal may be amplified with a selected LNA among the plurality of LNAs having outputs that are combined and residing on a front-end module (block 1014). An amplified RF signal from the selected LNA may be received by receive circuits residing on an IC via a single interconnection coupling the plurality of LNAs to the receive circuits (block 1016). The receive circuits may process the amplified RF signal and provide an analog input signal.

An analog output signal may be conditioned (e.g., amplified, filtered, upconverted, etc.) by transmit circuits residing on the IC to obtain an output RF signal (block 1018). The output RF signal may be amplified with a selected power amplifier among at least one power amplifier residing on the front-end module (block 1020).

Multiple LNAs with combined outputs, as described herein, may be implemented on an IC, an analog IC, an RFIC, a mixed-signal IC, an ASIC, a printed circuit board (PCB), an electronic device, etc. Multiple LNAs with combined outputs may be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing multiple LNAs with combined outputs, as described herein, may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first circuit comprising a first plurality of low noise amplifiers (LNAs) each having an input and having outputs that are combined to form a first combined output, the first plurality of LNAs being for a first radio technology;
   a second circuit comprising a second plurality of LNAs each having an input and having outputs that are combined to form a second combined output, the first plurality of LNAs being distinct from the second plurality of LNAs, the second plurality of LNAs being for the first radio technology;
a selecting device configured to select at least one LNA of the first or second plurality of LNAs to amplify an input radio frequency (RF) signal and provide an amplified RF signal;
a first duplexer coupled to a first switch of the selecting device and a second duplexer coupled to a second switch of the selecting device, the first duplexer and the second duplexer coupled to the input of respective LNAs of the first plurality of LNAs;
a third duplexer coupled to a third switch of the selecting device and a fourth duplexer coupled to a fourth switch of the selecting device, the third duplexer and the fourth duplexer coupled to the input of respective LNAs of the second plurality of LNAs;
a first power amplifier coupled to the first duplexer via a fifth switch and to the second duplexer via a sixth switch;
a second power amplifier coupled to the third duplexer via a seventh switch and to the fourth duplexer via an eighth switch, wherein the selecting device is distinct from one or more of the fifth switch, the sixth switch, the seventh switch, and the eighth switch; and
an integrated circuit (IC), distinct from the first circuit and the second circuit, comprising:
first receive circuits to process the amplified RF signal via a first interconnection coupled to the first combined output of the first plurality of LNAs and comprising a first amplifier having an input coupled to the first interconnection and an output coupled to a first mixer, wherein the first amplifier is bypassable,
second receive circuits to process the amplified RF signal via a second interconnection coupled to the second combined output of the second plurality of LNAs and comprising a second amplifier having an input coupled to the second interconnection and an output coupled to a second mixer, and
a first transmit circuit coupled to the first power amplifier and a second transmit circuit coupled to the second power amplifier.

2. The apparatus of claim 1, wherein the first, second, third, or fourth duplexer is configured for a plurality of frequency bands, and the first power amplifier supports a first of the plurality of frequency bands and the second power amplifier supports a second of the plurality of frequency bands.

3. The apparatus of claim 1, wherein a subset of the first or second plurality of LNAs is enabled at any given moment and remaining ones of the first and second plurality of LNAs are disabled.

4. The apparatus of claim 1, each of the first plurality of LNAs comprising:
a first transistor having a gate configured to receive an input radio frequency (RF) signal; and
a second transistor having a drain coupled to a summing node and a source coupled to a drain of the first transistor.

5. The apparatus of claim 1, each of the first plurality of LNAs comprising:
a first transistor having a gate configured to receive an input radio frequency (RF) signal and a drain coupled to a summing node.

6. The apparatus of claim 5, the first plurality of LNAs comprising:

a second transistor having a source coupled to the summing node and a drain configured to provide an amplified RF signal.

7. The apparatus of claim 5, the receive circuits comprising:
a common gate stage configured to provide bias current for the first plurality of LNAs; and
an amplifier coupled to the common gate stage.

8. The apparatus of claim 1, each of the first plurality of LNAs comprising:
a single-ended LNA configured to receive a single-ended input radio frequency (RF) signal and configured to provide a single-ended amplified RF signal.

9. The apparatus of claim 1, each of the first plurality of LNAs comprising:
a differential LNA configured to receive a differential input radio frequency (RF) signal and configured to provide a differential amplified RF signal.

10. The apparatus of claim 1, the first plurality of LNAs comprising:
a load inductor shared by the plurality of LNAs.

11. The apparatus of claim 10, the first plurality of LNAs further comprising:
an adjustable capacitor coupled in parallel with the load inductor.

12. The apparatus of claim 1, wherein the first plurality of LNAs are associated with at least one of different transistor sizes, different transistor biasing, or different LNA circuit designs.

13. The apparatus of claim 1, wherein the first circuit is configured to process a first frequency band and the second circuit is configured to process a second frequency band.

14. The apparatus of claim 13, wherein the first frequency band comprises a low band and wherein the second frequency band comprises a high band.

15. The apparatus of claim 1, comprising an RF front-end module including a housing and a plurality of I/O ports, the first and second circuits being in the housing, the first combined output and the first interconnection being coupled to a first I/O port of the plurality of I/O ports, the second combined output and the second interconnection being coupled to a second I/O port of the plurality of I/O ports, and the IC comprises an RFIC being distinct from the RF front-end module.

16. The apparatus of claim 15, wherein the RF front-end module further includes the first power amplifier, the second power amplifier, the selecting device, the fifth switch, the sixth switch, the seventh switch, and the eighth switch.

17. The apparatus of claim 1, further comprising a ninth switch and a tenth switch, the ninth switch configured to couple an output of a first LNA of the first plurality of LNAs to a common node, the tenth switch configured to couple an output of a second LNA of the first plurality of LNAs to the common node.

18. A method comprising:
filtering by at least one duplexer of a plurality of duplexers, included in a front-end module comprising a plurality of integrated circuit (IC) dies mounted on a substrate, an input radio frequency (RF) signal to provide a filtered RF signal;
selecting, through a selecting device, one low noise amplifier (LNA) of a first plurality or a second plurality of LNAs included in the front-end module, the first plurality of LNAs each having an input and having outputs that are combined and the second plurality of LNAs each having an input and having outputs that are combined, the first plurality of LNAs being distinct from the second plurality of LNAs, the first plurality of LNAs being for a first radio technology and the second plurality of LNAs being for the first radio technology, wherein a first duplexer of the plurality of duplexers coupled to a first switch of the selecting device and a second duplexer of the plurality of duplexers coupled to a second switch of the selecting device, the first duplexer and the second duplexer are coupled to the input of respective LNAs of the first plurality of LNAs and coupled to a first power amplifier via one or more additional switches, and wherein a third duplexer of the plurality of duplexers is coupled to a third switch of the selecting device and a fourth duplexer of the plurality of duplexers is coupled to a fourth switch of the selecting device, the third duplexer and the fourth duplexer are coupled to the input of respective LNAs of the second plurality of LNAs and coupled to a second power amplifier via one or more additional switches, wherein the selecting device is distinct from one or more of the additional switches;

amplifying the filtered RF signal for the selected LNA;

receiving at a first or second receive circuit included in another IC, distinct from the front-end module, the amplified input RF signal from the selected LNA via a first or second interconnection between respective I/O ports of the front-end module and respective I/O ports of the another IC, the first receive circuit comprising a first amplifier having an input coupled to the first interconnection and an output coupled to a first mixer, wherein the first amplifier is bypassable, and the second receive circuit comprising a second amplifier having an input coupled to the second interconnection and an output coupled to a second mixer; and amplifying and thereafter downconverting the received amplified input RF signal, wherein a first I/O port of the respective I/O ports of the front-end module is coupled to the combined output of the first plurality of LNAs, and a second I/O port of the respective I/O ports of the front-end module is coupled to the combined output of the second plurality of LNAs.

19. The method of claim 18, further comprising:

conditioning, with transmit circuits residing on the another IC, an analog output signal to obtain an output RF signal; and amplifying the output RF signal with a selected power amplifier among the first power amplifier and the second power amplifier residing on the front-end module.

20. An apparatus comprising:

a module implemented in a package and comprising a first I/O port, a second I/O port, and a plurality of circuits attached to a circuit board, the plurality of circuits comprising:

first and second means for filtering an input radio frequency (RF) signal to provide first respective filtered RF signals;

third and fourth means for filtering the input RF signal to provide second respective filtered RF signals;

a first plurality of means for amplifying the first respective filtered RF signals for a first radio technology, each of the first plurality of amplifying means coupled to a respective one of the first and second means for filtering, the first plurality of amplifying means having outputs that are combined to form a combined output coupled to a first interconnection via the first I/O port;

a second plurality of means for amplifying the second respective filtered RF signals for the first radio technology, each of the second plurality of amplifying means coupled to a respective one of the third and fourth means for filtering, the second plurality of amplifying means having outputs that are combined to form a combined output coupled to a second interconnection via the second I/O port, the second plurality of amplifying means being separate from the first plurality of amplifying means;

a selecting device to select one of the amplifying means, the selected amplifying means configured to amplify one of the respective filtered RF signals to provide an amplified RF signal, the first and second means for filtering coupled to respective first and second switches of the selecting device and the third and fourth means for filtering coupled to respective third and fourth switches of the selecting device;

a first power amplifying means coupled to the first means for filtering via at least a fifth switch; and a second power amplifying means coupled to the third means for filtering via at least a sixth switch;

first means for receiving the amplified RF signal via the first interconnection at an integrated circuit (IC), the first means for receiving comprising third means for amplifying and first means for downconverting at the IC the amplified RF signal received via the first interconnection, wherein the third means for amplifying is bypassable; and second means for receiving the amplified RF signal via the second interconnection at the IC, the IC being separate from the module, the second means for receiving comprising fourth means for amplifying and second means for downconverting at the IC the amplified RF signal received via the second interconnection, wherein the selecting device is distinct from one or more of the fifth switch and the sixth switch.

* * * * *